US012784655B2

(12) United States Patent
Chen et al.

(10) Patent No.: US 12,784,655 B2
(45) Date of Patent: Nov. 3, 2026

(54) DISPLAY PANEL, DISPLAY DEVICE, AND DRIVING CONTROL METHOD

(71) Applicants: Chengdu BOE Optoelectronics Technology Co., Ltd., Sichuan Province (CN); BOE Technology Group Co., Ltd., Beijing (CN)

(72) Inventors: Yipeng Chen, Beijing (CN); Ling Shi, Beijing (CN); Hongda Han, Beijing (CN)

(73) Assignees: Chengdu BOE Optoelectronics Technology Co., Ltd., Chendgu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/994,802

(22) PCT Filed: Mar. 13, 2024

(86) PCT No.: PCT/CN2024/081518
§ 371 (c)(1),
(2) Date: Jan. 15, 2025

(87) PCT Pub. No.: WO2024/222273
PCT Pub. Date: Oct. 31, 2024

(65) Prior Publication Data

US 2026/0038422 A1 Feb. 5, 2026

(30) Foreign Application Priority Data

Apr. 26, 2023 (CN) ........................ 202310462243.6

(51) Int. Cl.
*G09G 3/32* (2016.01)
*G11C 19/28* (2006.01)

(52) U.S. Cl.
CPC ............. *G09G 3/32* (2013.01); *G11C 19/287* (2013.01); *G09G 2310/0267* (2013.01); *G09G 2310/0286* (2013.01)

(58) Field of Classification Search
CPC .............. G09G 2310/0286; G09G 2310/0267; G09G 3/32; G09G 3/20; G11C 19/287
See application file for complete search history.

(56) References Cited

U.S. PATENT DOCUMENTS

| | | | | |
|---|---|---|---|---|
| 5,881,299 | A | 3/1999 | Nomura et al. | |
| 2005/0206637 | A1 | 9/2005 | Takahashi et al. | |
| 2008/0055225 | A1 * | 3/2008 | Pak ...................... | G09G 3/3677 345/100 |
| 2011/0193836 | A1 | 8/2011 | Umezaki | |

(Continued)

FOREIGN PATENT DOCUMENTS

| | | | |
|---|---|---|---|
| CN | 101136185 | A | 3/2008 |
| CN | 103021359 | A | 4/2013 |

(Continued)

OTHER PUBLICATIONS

U.S. Non-Final Office Action, dated May 7, 2026, from U.S. Appl. No. 18/848,501, 26 pages.

*Primary Examiner* — Muhammad N Edun
(74) *Attorney, Agent, or Firm* — Workman Nydegger

(57) ABSTRACT

A display panel, a display device, and a driving control method. The display panel includes a shift register unit and output control signal lines coupled to the shift register unit. The output control signal lines are arranged between the shift register unit and a display region of the display panel. The shift register unit includes: a shift register, which is configured to output a cascade signal by a cascade output end; and an output circuit, which is coupled to the shift register, the output circuit being configured to control, according to a signal of an output control signal end and a signal of a first reference signal end, a driving output end to (Continued)

output a gate scanning signal; an output control signal end is coupled to one of output control signal lines.

20 Claims, 15 Drawing Sheets

(56) References Cited

U.S. PATENT DOCUMENTS

| | | | | |
|---|---|---|---|---|
| 2017/0004760 | A1 | 1/2017 | Jang et al. | |
| 2018/0075808 | A1 | 3/2018 | Yamashita et al. | |
| 2021/0264863 | A1 | 8/2021 | Wang et al. | |
| 2022/0327987 | A1* | 10/2022 | Sun | G09G 3/3677 |
| 2022/0398968 | A1* | 12/2022 | Wang | G09G 3/2096 |
| 2023/0059832 | A1* | 2/2023 | Wu | G09G 3/3266 |

FOREIGN PATENT DOCUMENTS

| | | | |
|---|---|---|---|
| CN | 106782399 | A | 5/2017 |
| CN | 110415637 | A | 9/2018 |
| CN | 109637478 | A | 4/2019 |
| CN | 109920380 | A | 6/2019 |
| CN | 109935209 | A | 6/2019 |
| CN | 110085159 | A | 8/2019 |
| CN | 108597437 | A | 11/2019 |
| CN | 110582805 | A | 12/2019 |
| CN | 111179858 | A | 5/2020 |
| CN | 111477159 | A | 7/2020 |
| CN | 112530501 | A | 3/2021 |
| CN | 113178161 | A | 7/2021 |
| CN | 113838402 | A | 12/2021 |
| CN | 114270431 | A | 4/2022 |
| CN | 114464119 | A | 5/2022 |
| CN | 114495784 | A | 5/2022 |
| CN | 110060645 | B | 8/2022 |
| CN | 115831205 | A | 3/2023 |
| JP | 2001249636 | A | 9/2001 |
| JP | 2021043459 | A | 3/2021 |
| WO | 2015137710 | A1 | 9/2015 |
| WO | 2022188019 | A1 | 9/2022 |

* cited by examiner

020

030

040

DISPLAY PANEL, DISPLAY DEVICE, AND DRIVING CONTROL METHOD

CROSS-REFERENCE TO RELATED APPLICATIONS

This application is a National Stage of International Application No. PCT/CN2024/081518, filed Mar. 13, 2024, which claims priority to Chinese Patent Application No. 202310462243.6, filed with the China National Intellectual Property Administration on Apr. 26, 2023 and entitled "Display panel, display device and driving control method", both of which are hereby incorporated by reference in their entireties.

TECHNICAL FIELD

The present disclosure relates to the field of display technology, and in particular to a display panel, a display device, and a driving control method.

BACKGROUND

With the rapid development of display technology, display panels have shown a trend of high integration and low cost. Among them, the array substrate row drive technology (Gate Driver on Array, GOA) integrates the drive control circuit on the array substrate of the display panel to form a scan drive for the display panel. At present, the drive control circuit is usually composed of multiple cascaded shift register units.

SUMMARY

Some embodiments of the present disclosure provide a display panel, including:

a shift register unit and a plurality of output control signal lines coupled to the shift register unit; the plurality of output control signal lines being arranged between the shift register unit coupled thereto and a display area of the display panel;

the shift register unit includes:

a shift register configured to output a cascade signal through a cascade output terminal;

an output circuit coupled to the shift register, and the output circuit being configured to control a driving output terminal to output a gate scanning signal according to a signal of an output control signal terminal and a signal of a first reference signal terminal, wherein the output control signal terminal is coupled to one of the plurality of output control signal lines.

In some embodiments of the present disclosure, wherein the output circuit includes: a first output circuit and a second output circuit;

the first output circuit is coupled to the cascade output terminal or a first node in the shift register and is configured to transmit the signal of the output control signal terminal to the driving output terminal in response to a signal of the cascade output terminal or a signal of the first node;

the second output circuit is coupled to a second node in the shift register, and is configured to transmit the signal of the first reference signal terminal to the driving output terminal in response to a signal of the second node.

In some embodiments of the present disclosure, the first output circuit includes: a first output transistor;

a gate of the first output transistor is coupled to the cascade output terminal or the first node, a first electrode of the first output transistor is coupled to the output control signal terminal, and a second electrode of the first output transistor is coupled to the driving output terminal.

In some embodiments of the present disclosure, the second output circuit includes: a second output transistor;

a gate of the second output transistor is coupled to the second node, a first electrode of the second output transistor is coupled to the first reference signal terminal, and a second electrode of the second output transistor is coupled to the driving output terminal.

In some embodiments of the present disclosure, the shift register includes:

an input subcircuit configured to provide a signal of an input signal terminal to a third node in response to a signal of a first clock signal terminal;

a control subcircuit configured to control signals of the first node and the second node, and provide a signal of the third node to the first node or the second node;

a cascade subcircuit configured to enable the cascade output terminal to output the cascade signal in response to the signals of the first node and the second node.

In some embodiments of the present disclosure, the input subcircuit includes: a first transistor;

a gate of the first transistor is coupled to the first clock signal terminal, a first electrode of the first transistor is coupled to the input signal terminal, and a second electrode of the first transistor is coupled to the third node.

In some embodiments of the present disclosure, the control subcircuit includes: a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a first capacitor, a second capacitor, a third capacitor and a fourth capacitor;

a gate of the second transistor is coupled to the third node, a first electrode of the second transistor is coupled to the first clock signal terminal, and a second electrode of the second transistor is coupled to a fourth node;

a gate of the third transistor is coupled to a second reference signal terminal, a first electrode of the third transistor is coupled to the fourth node, and a second electrode of the third transistor is coupled to a gate of the fourth transistor;

a first electrode of the fourth transistor is coupled to a second clock signal terminal, and a second electrode of the fourth transistor is coupled to a first electrode of the fifth transistor;

a gate of the fifth transistor is coupled to the second clock signal terminal, and a second electrode of the fifth transistor is coupled to the first node;

a gate of the sixth transistor is coupled to the first clock signal terminal, a first electrode of the sixth transistor is coupled to the input signal terminal, and a second electrode of the sixth transistor is coupled to a first electrode of the seventh transistor;

a gate of the seventh transistor is coupled to the second reference signal terminal, and a second electrode of the seventh transistor is coupled to a fifth node;

a gate of the eighth transistor is coupled to the fifth node, a first electrode of the eighth transistor is coupled to the fifth node, and a second electrode of the eighth transistor is coupled to the second node;

a gate of the ninth transistor is coupled to the first clock signal terminal, a first electrode of the ninth transistor is coupled to the second reference signal terminal, and a second electrode of the ninth transistor is coupled to a gate of the tenth transistor;

a first electrode of the tenth transistor is coupled to a third reference signal terminal, and a second electrode of the tenth transistor is coupled to a sixth node;

a gate of the eleventh transistor is coupled to the fifth node, a first electrode of the eleventh transistor is coupled to the sixth node, and a second electrode of the eleventh transistor is coupled to the second clock signal terminal;

a gate of the twelfth transistor is coupled to a first electrode of the fifteenth transistor, a first electrode of the twelfth transistor is coupled to the first node, and a second electrode of the twelfth transistor is coupled to a fourth reference signal terminal;

a gate of the thirteenth transistor is coupled to a fifth reference signal terminal, a first electrode of the thirteenth transistor is coupled to the fourth reference signal terminal, and a second electrode of the thirteenth transistor is coupled to a first electrode of the fourteenth transistor;

a gate of the fourteenth transistor is coupled to the first reference signal terminal, and a second electrode of the fourteenth transistor is coupled to the first electrode of the fifteenth transistor;

a gate of the fifteenth transistor is coupled to the first reference signal terminal, the first electrode of the fifteenth transistor is coupled to the third node, and a second electrode of the fifteenth transistor is coupled to the second node;

a first electrode of the first capacitor is coupled to the gate of the fourth transistor, and a second electrode of the first capacitor is coupled to the second electrode of the fourth transistor;

a first electrode of the second capacitor is coupled to the sixth node, and a second electrode of the second capacitor is coupled to the second electrode of the seventh transistor;

a first electrode of the third capacitor is coupled to the fourth reference signal terminal, and a second electrode of the third capacitor is coupled to the first node;

a first electrode of the fourth capacitor is coupled to the cascade output terminal, and a second electrode of the fourth capacitor is coupled to the first reference signal terminal.

In some embodiments of the present disclosure, the cascade subcircuit includes: a first cascade transistor and a second cascade transistor;

a gate of the first cascade transistor is coupled to the first node, a first electrode of the first cascade transistor is coupled to a fourth reference signal terminal, and a second electrode of the first cascade transistor is coupled to the cascade output terminal;

a gate of the second cascade transistor is coupled to the second node, a first electrode of the second cascade transistor is coupled to the cascade output terminal, and a second electrode of the second cascade transistor is coupled to the first reference signal terminal.

In some embodiments of the present disclosure, the input subcircuit includes: a sixteenth transistor and a seventeenth transistor;

a gate of the sixteenth transistor is coupled to the first clock signal terminal, a first electrode of the sixteenth transistor is coupled to the input signal terminal, and a second electrode of the sixteenth transistor is coupled to a seventh node;

a gate of the seventeenth transistor is coupled to the first clock signal terminal, a first electrode of the seventeenth transistor is coupled to the seventh node, and a second electrode of the seventeenth transistor is coupled to the third node.

In some embodiments of the present disclosure, the control subcircuit includes: an eighteenth transistor, a nineteenth transistor, a twentieth transistor, a twenty-first transistor, a twenty-second transistor, a twenty-third transistor, a fifth capacitor, and a sixth capacitor;

a gate of the eighteenth transistor is coupled to the cascade output terminal, a first electrode of the eighteenth transistor is coupled to a third clock signal terminal, and a second electrode of the eighteenth transistor is coupled to a seventh node;

a gate of the nineteenth transistor is coupled to the input signal terminal, a first electrode of the nineteenth transistor is coupled to the first reference signal terminal, and a second electrode of the nineteenth transistor is coupled to the second node;

a gate of the twentieth transistor is coupled to the second node, a first electrode of the twentieth transistor is coupled to the first reference signal terminal, and a second electrode of the twentieth transistor is coupled to an eighth node;

a gate of the twenty-first transistor is coupled to the second node, a first electrode of the twenty-first transistor is coupled to the eighth node, and a second electrode of the twenty-first transistor is coupled to the third node;

a gate of the twenty-second transistor is coupled to the third node, a first electrode of the twenty-second transistor is coupled to the eighth node, and a second electrode of the twenty-second transistor is coupled to a sixth reference signal terminal;

a gate of the twenty-third transistor is coupled to a fourth clock signal terminal, a first electrode of the twenty-third transistor is coupled to the second node, and a second electrode of the twenty-third transistor is coupled to the sixth reference signal terminal;

a first electrode of the fifth capacitor is coupled to the first reference signal terminal, and a second electrode of the fifth capacitor is coupled to the first electrode of the twenty-third transistor;

a first electrode of the sixth capacitor is coupled to the cascade output terminal, and a second electrode of the sixth capacitor is coupled to the first node.

In some embodiments of the present disclosure, the cascade subcircuit includes: a first cascade transistor and a second cascade transistor;

a gate of the first cascade transistor is coupled to the first node, a first electrode of the first cascade transistor is coupled to the cascade output terminal, and a second electrode of the first cascade transistor is coupled to a third clock signal terminal;

a gate of the second cascade transistor is coupled to the second node, a first electrode of the second cascade transistor is coupled to the first reference signal terminal, and a second electrode of the second cascade transistor is coupled to the cascade output terminal.

In some embodiments of the present disclosure, the control subcircuit includes: a twenty-fourth transistor, a twenty-fifth transistor, a twenty-sixth transistor, a twenty-seventh transistor, a twenty-eighth transistor, a seventh capacitor, and an eighth capacitor;

a gate of the twenty-fourth transistor is coupled to the first clock signal terminal, a first electrode of the twenty-fourth transistor is coupled to a seventh reference signal terminal, and a second electrode of the a transistor is coupled to the second node;

a gate of the twenty-fifth transistor is coupled to the third node, a first electrode of the twenty-fifth transistor is coupled to the second node, and a second electrode of the twenty-fifth transistor is coupled to the first clock signal terminal;

a gate of the twenty-sixth transistor is coupled to the second node, a first electrode of the twenty-sixth transistor is coupled to the first reference signal terminal, and a second electrode of the twenty-sixth transistor is coupled to a first electrode of the twenty-seventh transistor;

a gate of the twenty-seventh transistor is coupled to a third clock signal terminal, and a second electrode of the twenty-seventh transistor is coupled to a first electrode of the twenty-eighth transistor;

a gate of the twenty-eighth transistor is coupled to the seventh reference signal terminal, a first electrode of the twenty-eighth transistor is coupled to the third node, and a second electrode of the twenty-eighth transistor is coupled to the first node;

a first electrode of the seventh capacitor is coupled to the first reference signal terminal, and a second electrode of the seventh capacitor is coupled to the first node;

a first electrode of the eighth capacitor is coupled to the cascade output terminal, and a second electrode of the eighth capacitor is coupled to the first node.

Some embodiments of the present disclosure provide a display panel, including:

a base substrate including a display area and a non-display area;

the display area includes:

a plurality of sub-pixels;

a plurality of scan lines, wherein a row of sub-pixels in the plurality of sub-pixels is correspondingly coupled to at least one of the plurality of scan lines;

the non-display area includes:

a gate driving circuit including a plurality of shift register units in the display panel according to any one of above embodiments, wherein the driving output terminal of each of the plurality of shift register units is correspondingly coupled to at least one of the plurality of scan lines.

In some embodiments of the present disclosure, the display panel further includes:

a plurality of output control signal lines coupled to the gate driving circuit;

an extension direction of the plurality of output control signal lines is the same as an arrangement direction of the plurality of shift register units.

In some embodiments of the present disclosure, the plurality of output control signal lines are arranged between the gate driving circuit coupled thereto and the display area.

In some embodiments of the present disclosure, in two adjacent shift register units among the plurality of shift register units, an input signal terminal of a next shift register unit is coupled to a cascade output terminal of a previous shift register unit;

the plurality of output control signal lines include: a first output control signal line and a second output control signal line; the first output control signal line is coupled to output control signal terminals of odd-numbered shift register units, and the second output control signal line is coupled to output control signal terminals of even-numbered shift register units.

In some embodiments of the present disclosure, the display panel further includes:

a plurality of output control auxiliary signal lines;

a first insulating layer is provided between the plurality of output control auxiliary signal lines and the plurality of output control signal lines;

the plurality of output control auxiliary signal lines correspond to the plurality of output control signal lines in a one-to-one manner, and the output control auxiliary signal lines and the output control signal lines corresponding to each other are coupled to each other through first through holes penetrating the first insulating layer.

In some embodiments of the present disclosure, the display panel further includes:

a plurality of clock signal lines coupled to the gate driving circuit;

an extension direction of the plurality of clock signal lines is the same as an arrangement direction of the plurality of shift register units.

In some embodiments of the present disclosure, the plurality of clock signal lines are arranged on a side of the gate driving circuit coupled thereto away from the display area.

In some embodiments of the present disclosure, orthographic projections of the plurality of output control signal lines on the base substrate are arranged between orthographic projections of the plurality of clock signal lines on the base substrate and the display area.

In some embodiments of the present disclosure, an orthographic projection of the gate driving circuit on the base substrate is arranged between orthographic projections of the plurality of clock signal lines on the base substrate and orthographic projections of the plurality of output control signal lines on the base substrate, and the orthographic projections of the plurality of output control signal lines on the base substrate are arranged between the orthographic projection of the gate driving circuit on the base substrate and the display area.

In some embodiments of the present disclosure, an orthographic projection of the first output transistor on the base substrate is between an orthographic projection of the first cascade transistor on the base substrate and the display area.

In some embodiments of the present disclosure, a width of a channel of the first output transistor is greater than a width of a channel of the first cascade transistor.

In some embodiments of the present disclosure, the width of the channel of the first output transistor is not less than 100 μm.

In some embodiments of the present disclosure, the width of the channel of the first cascade transistor is not greater than 60 μm.

In some embodiments of the present disclosure, an orthographic projection of the second output transistor on the base substrate is between an orthographic projection of the second cascade transistor on the base substrate and the display area.

In some embodiments of the present disclosure, a width of a channel of the second output transistor is greater than a width of a channel of the second cascade transistor.

In some embodiments of the present disclosure, the width of the channel of the second output transistor is not less than 100 μm.

In some embodiments of the present disclosure, the width of the channel of the second cascade transistor is not greater than 60 μm.

Some embodiments of the present disclosure provide a display device, including:

the aforementioned display panel;

a drive control circuit coupled to the display panel, and configured to:

input a first output control signal to output control signal terminals of the plurality of shift register units in a case of adopting a full-screen driving mode, so that the plurality of shift register units sequentially output gate scanning signals and drive the scan lines row by row;

input a second output control signal to the output control signal terminals of the plurality of shift register units in a case of adopting a local driving mode, so that some of the plurality of shift register units sequentially output gate scanning signals, and a rest of the plurality of shift register units output an invalid scanning signal.

Some embodiments of the present disclosure provide a driving control method, including:

in a case of adopting a full-screen driving mode, inputting a first output control signal to output control signal terminals of a plurality of shift register units, so that the plurality of shift register units sequentially output gate scanning signals and drive scan lines row by row;

in a case of adopting a local driving mode, inputting a second output control signal to the output control signal terminals of the plurality of shift register units, so that some of the plurality of shift register units sequentially output gate scanning signals and a rest of the plurality of shift register units output an invalid scanning signal, and drive some of the scan lines.

In some embodiments of the present disclosure, the first output control signal is a fixed voltage signal with a first level.

In some embodiments of the present disclosure, the second output control signal includes a fixed voltage signal portion with a first level and a fixed voltage signal portion with a second level, the fixed voltage signal portion with the first level is input into the some of the plurality of shift register units, and the fixed voltage signal portion with the second level is input into the rest of the plurality of shift register units.

In some embodiments of the present disclosure, the first output control signal is a clock signal.

In some embodiments of the present disclosure, the second output control signal includes a clock signal portion and a fixed voltage signal portion with a first level; the clock signal portion of the second output control signal is input to the some of the plurality of the shift register units, and the fixed voltage signal portion with the first level is input to the rest of the plurality of shift register units.

DETAILED DESCRIPTION

Figure 1:
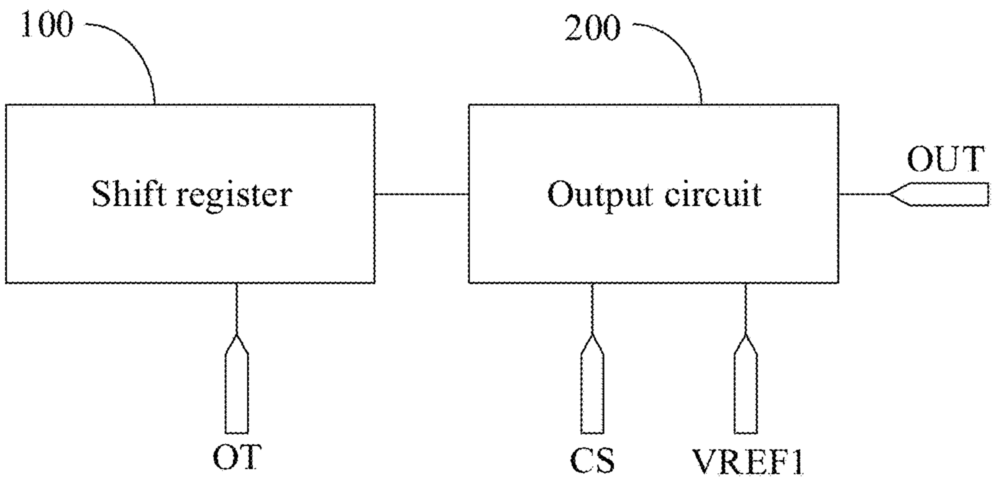
FIG. 1 is a schematic diagram of some structures of a shift register unit provided by an embodiment of the present disclosure.

In order to make the purpose, technical solution and advantages of the embodiments of the present disclosure clearer, the technical solution of the embodiments of the present disclosure will be clearly and completely described below in conjunction with the drawings of the embodiments of the present disclosure. Obviously, the described embodiments are part of the embodiments of the present disclosure, not all of the embodiments. And in the absence of conflict, the embodiments in the present disclosure and the features in the embodiments can be combined with each other. Based on the described embodiments of the present disclosure, all other embodiments obtained by ordinary technicians in the field without creative work are within the scope of protection of the present disclosure.

Unless otherwise defined, the technical terms or scientific terms used in the present disclosure should be understood by people with ordinary skills in the field to which the present disclosure belongs. “First”, “second” and similar words used in the present disclosure do not indicate any order, quantity or importance, but are only used to distinguish different components. "Include" or "comprising" and similar words mean that the elements or objects appearing before the word cover the elements or objects listed after the word and their equivalents, without excluding other elements or objects. "Coupled" or "connected" and similar words are not limited to physical or mechanical coupling, but may include electrical coupling, whether direct or indirect.

It should be noted that the sizes and shapes of the figures in the accompanying drawings do not reflect the actual proportions, and are only intended to illustrate the present disclosure. The same or similar reference numerals throughout represent the same or similar elements or elements having the same or similar functions.

The present disclosure provides a shift register unit, as shown in FIG. 1, including:

- a shift register 100 configured to output a cascade signal through a cascade output terminal OT;
- an output circuit 200 coupled to the shift register 100, and configured to control the driving output terminal OUT to output a gate scanning signal according to the signal of the output control signal terminal CS and the signal of the first reference signal terminal VREF1.

The embodiment of the present disclosure provides a shift register unit, which enables the shift register to output a cascade signal, and controls the gate scanning signal of the driving output terminal in the output circuit by controlling the signal of the output control signal terminal. When the shift register unit is applied to a display panel, the signal of the output control signal terminal can be controlled to scan any area of the display panel, thereby realizing flexible adjustment of the refresh frequency of different areas, saving power consumption, and reducing losses.

Figure 2:
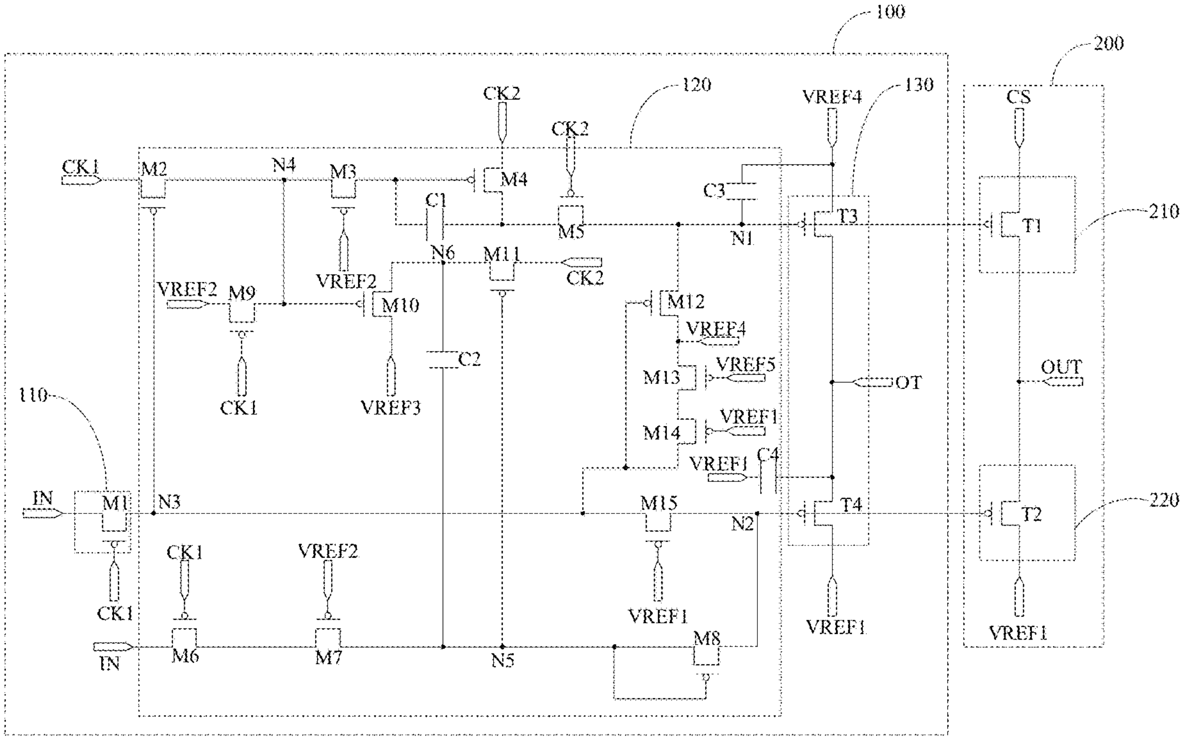
FIG. 2 is a schematic diagram of some further structures of the shift register unit provided by an embodiment of the present disclosure.

In some embodiments of the present disclosure, as shown in FIG. 2, the output circuit 200 includes: a first output circuit 210 and a second output circuit 220. The first output circuit 210 is coupled to the first node N1 in the shift register 100, and is configured to transmit the signal from the output control signal terminal CS to the driving output terminal OUT in response to the signal of the first node N1. The second output circuit 220 is coupled to the second node N2 in the shift register 100, and is configured to transmit the signal from the first reference signal terminal VREF1 to the driving output terminal OUT in response to the signal of the second node N2.

In some embodiments of the present disclosure, as shown in FIG. 2, the first output circuit 210 includes: a first output transistor T1. The gate of the first output transistor T1 is coupled to the first node N1, the first electrode of the first output transistor T1 is coupled to the output control signal terminal CS, and the second electrode of the first output transistor T1 is coupled to the driving output terminal OUT.

In some embodiments of the present disclosure, as shown in FIG. 2, the second output circuit 220 includes: a second output transistor T2. The gate of the second output transistor T2 is coupled to the second node N2, the first electrode of the second output transistor T2 is coupled to the first reference signal terminal VREF1, and the second electrode of the second output transistor T2 is coupled to the driving output terminal OUT.

Alternatively, the first output circuit may also be coupled to the cascade output terminal in the shift register, and the first output circuit is configured to transmit the signal from the output control signal terminal to the driving output terminal in response to the signal from the cascade output terminal. Based on this, the gate of the first output transistor is coupled to the cascade output terminal in the shift register.

In some embodiments of the present disclosure, compared with the method of coupling the gate of the first output transistor to the cascade output terminal in the shift register, the method of coupling the gate of the first output transistor to the first node has a better technical effect. Taking FIG. 2 as an example, the gate of the first output transistor T1 is coupled to the first node N1, and the voltage of the low-level signal that the driving output terminal OUT can output is VGL. If the gate of the first output transistor is coupled to the cascade output terminal in the shift register, since the voltage of the low-level signal that the cascade output terminal can output can only be VGL, the voltage of the low-level signal that the driving output terminal OUT can output can only be VGL-Vth.

In some embodiments of the present disclosure, as shown in FIG. 2, the shift register 100 includes: an input subcircuit 110 configured to provide a signal of an input signal terminal IN to a third node N3 in response to a signal of a first clock signal terminal CK1;

- a control subcircuit 120 configured to control the signals of the first node N1 and the second node N2, and provide the signal of the third node N3 to the first node N1 or the second node N2;
- a cascade subcircuit 130 configured to enable the cascade output terminal OT to output a cascade signal in response to the signals of the first node N1 and the second node N2.

In some embodiments of the present disclosure, as shown in FIG. 2, the input subcircuit 110 includes: a first transistor M1. The gate of the first transistor M1 is coupled to the first clock signal terminal CK1, a first electrode of the first transistor M1 is coupled to the input signal terminal IN, and a second electrode of the first transistor M1 is coupled to a third node N3.

In some embodiments of the present disclosure, as shown in FIG. 2, the control subcircuit 120 includes: a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a fourteenth transistor M14, a fifteenth transistor M15, a first capacitor C1, a second capacitor C2, a third capacitor C3, and a fourth capacitor C4.

The gate of the second transistor M2 is coupled to the third node N3, the first electrode of the second transistor M2 is coupled to the first clock signal terminal CK1, and the second electrode of the second transistor M2 is coupled to the fourth node N4. The gate of the third transistor M3 is coupled to the second reference signal terminal VREF2, the first electrode of the third transistor M3 is coupled to the fourth node N4, and the second electrode of the third transistor M3 is coupled to the gate of the fourth transistor M4. The first electrode of the fourth transistor M4 is coupled to the second clock signal terminal CK2, and the second electrode of the fourth transistor M4 is coupled to the first electrode of the fifth transistor M5. The gate of the fifth transistor M5 is coupled to the second clock signal terminal CK2, and the second electrode of the fifth transistor M5 is coupled to the first node N1. The gate of the sixth transistor M6 is coupled to the first clock signal terminal CK1, and the first electrode of the sixth transistor M6 is coupled to the input signal terminal IN is coupled, the second electrode of the sixth transistor M6 is coupled to the first electrode of the seventh transistor M7. The gate of the seventh transistor M7 is coupled to the second reference signal terminal VREF2, and the second electrode of the seventh transistor M7 is coupled to the fifth node N5. The gate of the eighth transistor M8 is coupled to the fifth node N5, the first electrode of the eighth transistor M8 is coupled to the fifth node N5, and the second electrode of the eighth transistor M8 is coupled to the second node N2. The gate of the ninth transistor M9 is coupled to the first clock signal terminal CK1, the first electrode of the ninth transistor M9 is coupled to the second reference signal terminal VREF2, and the second electrode of the ninth transistor M9 is coupled to the gate of the tenth transistor M10. The first electrode of the tenth transistor M10 is coupled to the third reference signal terminal VREF3, and the second electrode of the tenth transistor M10 is coupled to the sixth node N6. The gate of the eleventh transistor M11 is coupled to the fifth node N5, the first electrode of the eleventh transistor M11 is coupled to the sixth node N6, and the second electrode of the eleventh transistor M11 is coupled to the second reference signal terminal VREF2. The gate of the twelfth transistor M12 is coupled to the first electrode of the fifteenth transistor M15, the first electrode of the twelfth transistor M12 is coupled to the first node N1, and the second electrode of the twelfth transistor M12 is coupled to the fourth reference signal terminal VREF4. The gate of the thirteenth transistor M13 is coupled to the fifth reference signal terminal VREF5, the first electrode of the thirteenth transistor M13 is coupled to the fourth reference signal terminal VREF4, and the second electrode of the thirteenth transistor M13 is coupled to the first electrode of the fourteenth transistor M14. The gate of the fourteenth transistor M14 is coupled to the first reference signal terminal VREF1, and the second electrode of the fourteenth transistor M14 is coupled to the fifteenth transistor M 15 is coupled to the first electrode of the transistor 15. The gate of the fifteenth transistor M15 is coupled to the first reference signal terminal VREF1, the first electrode of the fifteenth transistor M15 is coupled to the third node N3, and the second electrode of the fifteenth transistor M15 is coupled to the second node N2. The first electrode of the first capacitor C1 is coupled to the gate of the fourth transistor M4, and the second electrode of the first capacitor C1 is coupled to the second electrode of the fourth transistor M4. The first electrode of the second capacitor C2 is coupled to the sixth node N6, and the second electrode of the second capacitor C2 is coupled to the second electrode of the seventh transistor M7. The first electrode of the third capacitor C3 is coupled to the fourth reference signal terminal VREF4, and the second electrode of the third capacitor C3 is coupled to the first node N1. The first electrode of the fourth capacitor C4 is coupled to the cascade output terminal OT, and the second electrode of the fourth capacitor C4 is coupled to the first reference signal terminal VREF1.

In some embodiments of the present disclosure, as shown in FIG. 2, the cascade subcircuit 130 includes: a first cascade transistor T3 and a second cascade transistor T4. The gate of the first cascade transistor T3 is coupled to the first node N1, the first electrode of the first cascade transistor T3 is coupled to the fourth reference signal terminal VREF4, and the second electrode of the first cascade transistor T3 is coupled to the cascade output terminal OT. The gate of the second cascade transistor T4 is coupled to the second node N2, the first electrode of the second cascade transistor T4 is coupled to the cascade output terminal OT, and the second electrode of the second cascade transistor T4 is coupled to the first reference signal terminal VREF1.

Exemplarily, the effective pulse signal of the cascade signal outputted from the cascade output terminal may be a high-level signal, the effective pulse signal of the gate scanning signal outputted from the driving output terminal may be a high-level signal, the effective pulse signal of the first reference signal outputted from the first reference signal terminal may be a low-level signal, the effective pulse signal of the second reference signal outputted from the second reference signal terminal may be a low-level signal, the effective pulse signal of the third reference signal outputted from the third reference signal terminal may be a high-level signal, and the effective pulse signal of the fourth reference signal outputted from the fourth reference signal terminal may be a high-level signal. Alternatively, the effective pulse signal of the cascade signal outputted from the cascade output terminal may be a low-level signal, the effective pulse signal of the gate scanning signal outputted from the driving output terminal may be a low-level signal, the effective pulse signal of the first reference signal outputted from the first reference signal terminal may be a high-level signal, the effective pulse signal of the second reference signal outputted from the second reference signal terminal may be a high-level signal, the effective pulse signal of the third reference signal outputted from the third reference signal terminal may be a low-level signal, and the effective pulse signal of the fourth reference signal outputted from the fourth reference signal terminal may be a low-level signal.

For example, in order to reduce the manufacturing process, all transistors can be P-type transistors. Alternatively, all transistors can be N-type transistors, which is not limited here. Further, N-type transistors are turned on by high-level signals and turned off by low-level signals; P-type transistors are turned off by high-level signals and turned on by low-level signals.

It should be noted that the transistors mentioned in the above embodiments of the present disclosure may be thin film transistors (TFT) or metal oxide semiconductor (MOS) field effect transistors, which are not limited here. In a specific implementation, the first electrode of the above transistor may be used as its source electrode and the second electrode may be used as its drain electrode, or the first electrode may be used as its drain electrode and the second electrode may be used as its source electrode, depending on the type of transistor and the input signal, without making a specific distinction here.

Figure 3:
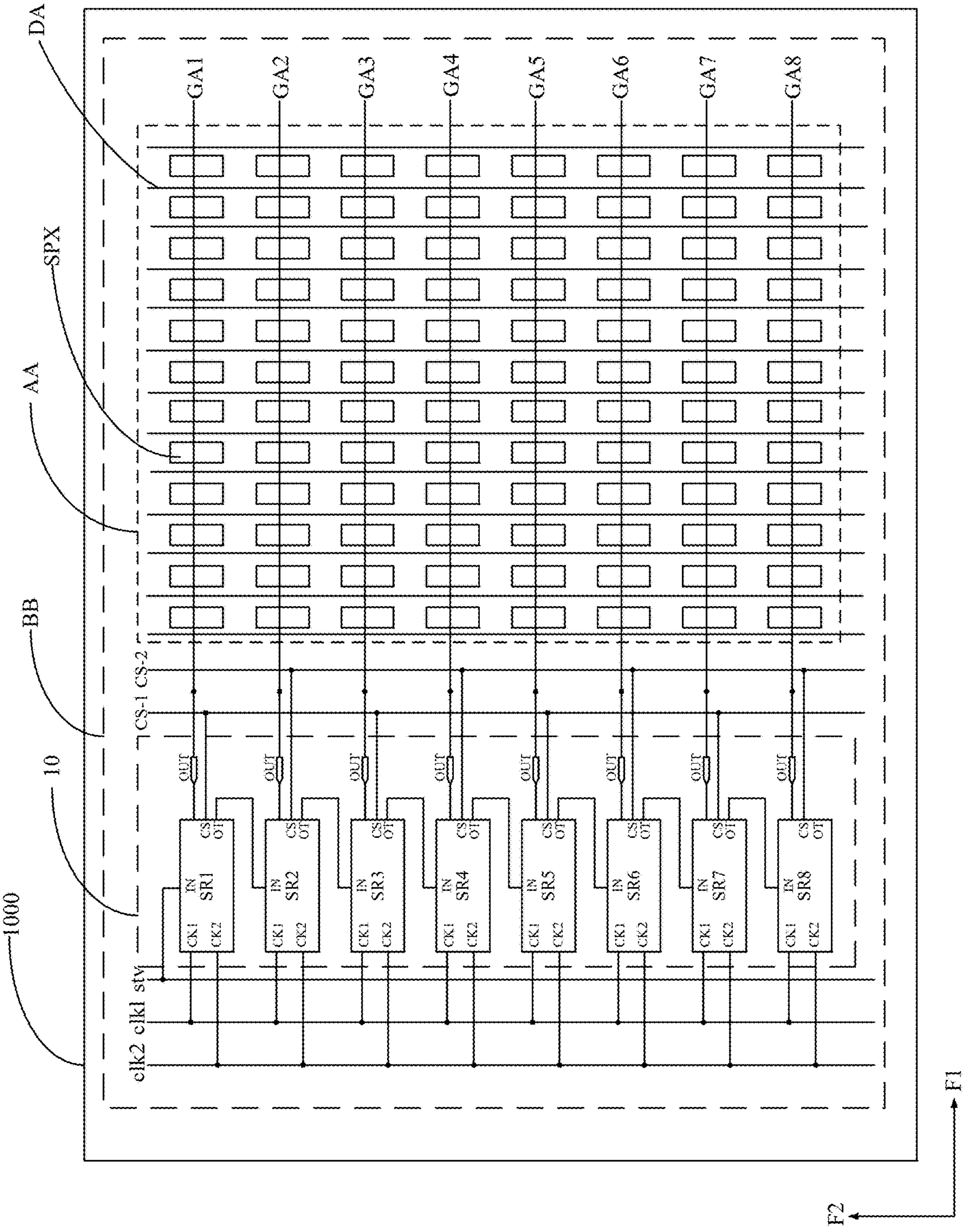
FIG. 3 is a schematic diagram of some structures of a display panel provided by an embodiment of the present disclosure.

The present disclosure provides a display panel, as shown in FIG. 3, including:

a base substrate 1000 including a display area AA and a non-display area BB;

the display area AA includes:

a plurality of sub-pixels SPX;

a plurality of scanning lines GA, a row of sub-pixels SPX in the plurality of sub-pixels SPX is correspondingly coupled to at least one scanning line GA in the plurality of scanning lines GA;

the non-display area BB includes:

a gate driving circuit 10 including the above-mentioned shift register units (for example, SR1, SR2, SR3, SR4, SR5, SR6, SR7, and SR8 in FIG. 3), and the driving output terminal OUT of each of the shift register units (for example, SR1, SR2, SR3, SR4, SR5, SR6, SR7, and SR8 in FIG. 3) is correspondingly coupled to at least one scan line GA in the scan lines GA.

In some embodiments of the present disclosure, as shown in FIG. 3, the display panel further includes: a plurality of output control signal lines (e.g., CS-1 and CS-2 in FIG. 3) coupled to the shift register units in the gate driving circuit 10. The output control signal terminal of one shift register unit is coupled to one of the plurality of output control signal lines. In addition, the extension direction of the plurality of output control signal lines (e.g., CS-1 and CS-2 in FIG. 3)

is the same as the arrangement direction of the plurality of shift register units (e.g., SR1, SR2, SR3, SR4, SR5, SR6, SR7, and SR8 in FIG. 3). Exemplarily, the extension direction of the plurality of output control signal lines (e.g., CS-1 and CS-2 in FIG. 3) is the second direction F2, and the arrangement direction of the plurality of shift register units (e.g., SR1, SR2, SR3, SR4, SR5, SR6, SR7, and SR8 in FIG. 3) is also the second direction F2. F1 in FIG. 3 is the first direction.

In some embodiments of the present disclosure, as shown in FIG. 3, a plurality of output control signal lines (e.g., CS-1 and CS-2 in FIG. 3) are disposed between the gate driving circuit 10 coupled thereto and the display area AA.

In some embodiments of the present disclosure, as shown in FIG. 3, in two adjacent shift register units among a plurality of shift register units (for example, SR1, SR2, SR3, SR4, SR5, SR6, SR7, and SR8 in FIG. 3), the input signal terminal IN of the next shift register unit is coupled to the cascade output terminal OT of the previous shift register unit. It should be noted that the input signal terminal IN of the first shift register unit SR1 among the plurality of shift register units (for example, SR1, SR2, SR3, SR4, SR5, SR6, SR7, and SR8 in FIG. 3) is coupled to the frame start signal line stv.

In some embodiments of the present disclosure, as shown in FIG. 3, a plurality of output control signal lines (e.g., CS-1 and CS-2 in FIG. 3) include: a first output control signal line CS-1 and a second output control signal line CS-2. The first output control signal line CS-1 is coupled to the output control signal terminal CS of the odd-numbered shift register unit, and the second output control signal line CS-2 is coupled to the output control signal terminal CS of the even-numbered shift register unit. Exemplarily, the first output control signal line CS-1 is coupled to the output control signal terminal CS in the shift register units SR1, SR3, SR5, and SR7; the second output control signal line CS-2 is coupled to the output control signal terminal CS in the shift register units SR2, SR4, SR6, and SR8.

In some embodiments of the present disclosure, as shown in FIG. 3, the display panel further includes: multiple clock signal lines (for example, clk1 and clk2 in FIG. 3) coupled to the gate driving circuit. The extension direction of the clock signal lines (for example, clk1 and clk2 in FIG. 3) is the same as the arrangement direction of the shift register units.

In some embodiments of the present disclosure, as shown in FIG. 3, the display panel further includes multiple output control auxiliary signal lines. There is a first insulating layer between the output control auxiliary signal lines and the output control signal lines. The output control auxiliary signal lines correspond to the output control signal lines in a one-to-one manner. The output control auxiliary signal line and the output control signal line which correspond to each other are coupled to each other through a first through hole penetrating the first insulating layer.

In some embodiments of the present disclosure, as shown in FIG. 14 to FIG. 20, the substrate is provided with the following in sequence: a semiconductor layer 010, a gate conductive layer 020, a capacitor electrode layer 030, a cascade wiring layer 040, a signal transmission wiring layer 050, and an auxiliary wiring layer 060. In addition, an insulating layer is provided between each two adjacent film layers in the semiconductor layer 010, the gate conductive layer 020, the capacitor electrode layer 030, the cascade wiring layer 040, the signal transmission wiring layer 050, and the auxiliary wiring layer 060. In addition, two film layers that need to be coupled are coupled to each other through a through hole penetrating the insulating layer.

Exemplarily, the semiconductor layer 010 includes the active layer in each of the above-mentioned transistors. The semiconductor layer can be formed by patterning a semiconductor material. The semiconductor layer can be used to make the active layers of the above-mentioned multiple transistors. Exemplarily, the semiconductor layer can be made of amorphous silicon, polycrystalline silicon, oxide semiconductor materials, etc. It should be noted that the above-mentioned source region and drain region can be conductive regions formed by doping with n-type impurities or p-type impurities.

Exemplarily, the gate conductive layer 020 includes the gate and the scan line in each of the above transistors. The gates of some transistors are reused as an electrode plate of the above capacitors.

Exemplarily, the capacitor electrode layer 030 includes another electrode plate in each of the above capacitors. Two electrode plates with facing areas form the above capacitors.

Exemplarily, the cascade wiring layer 040 includes cascade wirings for coupling the input signal terminal IN of the next shift register unit with the cascade output terminal OT of the previous shift register unit.

Exemplarily, the signal transmission wiring layer 050 includes a clock signal line, an output control signal line, and a source and a drain in each of the above transistors.

Exemplarily, the auxiliary wiring layer 060 includes output control auxiliary signal lines SC-1, SC-2 and other reference signal lines.

Figure 14:
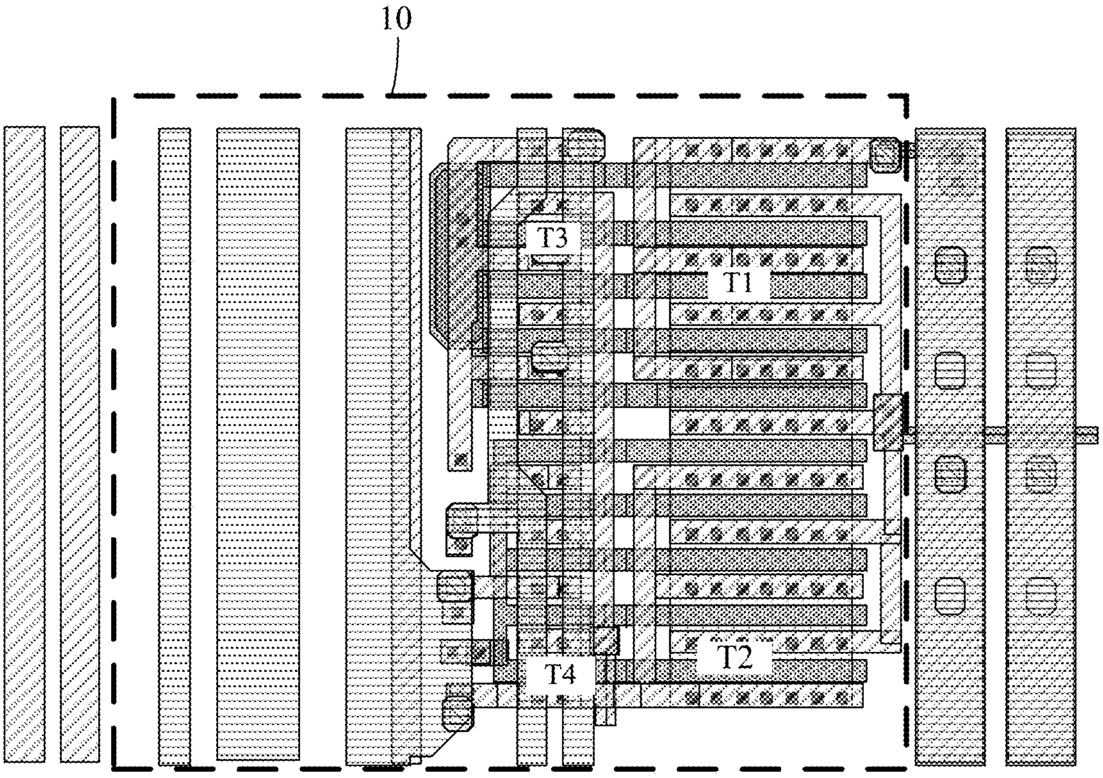
FIG. 14 is a schematic diagram of the layout structure of a shift register unit provided by an embodiment of the present disclosure.
Figure 15:
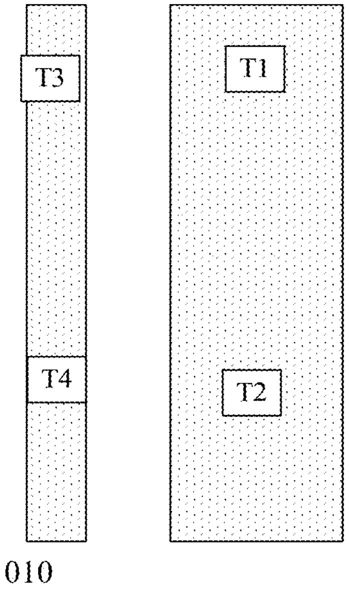
FIG. 15 is a schematic diagram of the layout structure of the semiconductor layer provided by an embodiment of the present disclosure.
Figure 16:
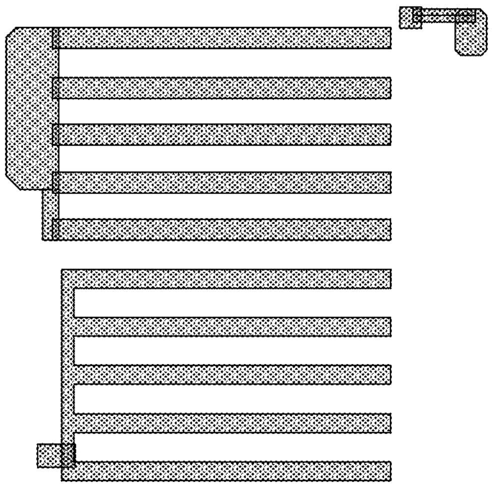
FIG. 16 is a schematic diagram of the layout structure of the gate conductive layer provided by an embodiment of the present disclosure.
Figure 17:
FIG. 17 is a schematic diagram of the layout structure of the capacitor electrode layer provided by an embodiment of the present disclosure.
Figure 18:
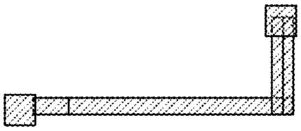
FIG. 18 is a schematic diagram of the layout structure of the cascade wiring layer provided by an embodiment of the present disclosure.
Figure 19:
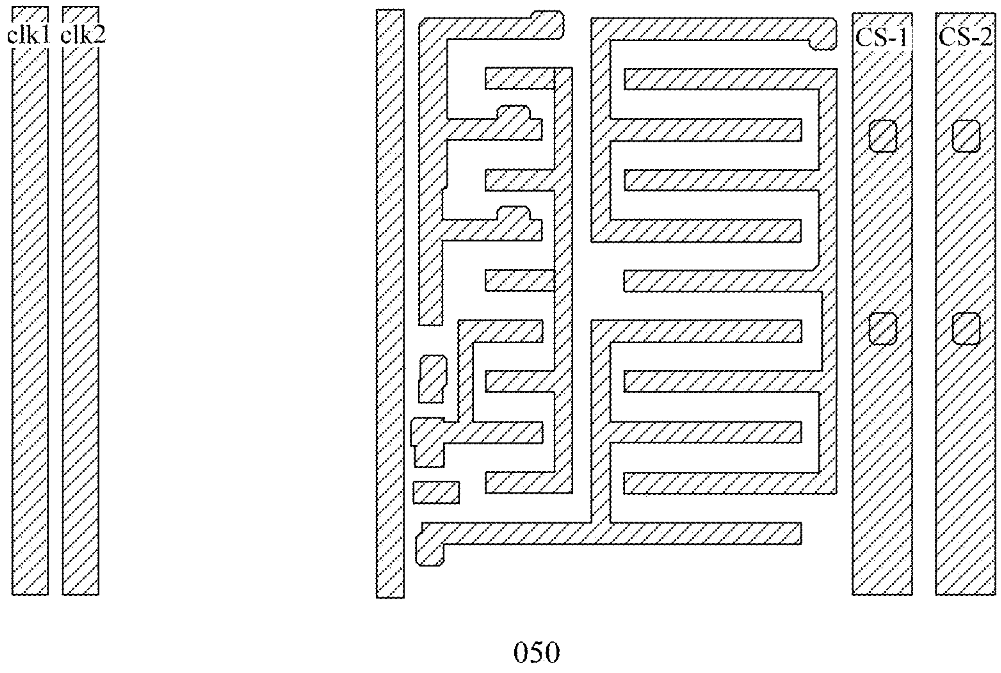
FIG. 19 is a schematic diagram of the layout structure of the transmission wiring layer provided by an embodiment of the present disclosure.
Figure 20:
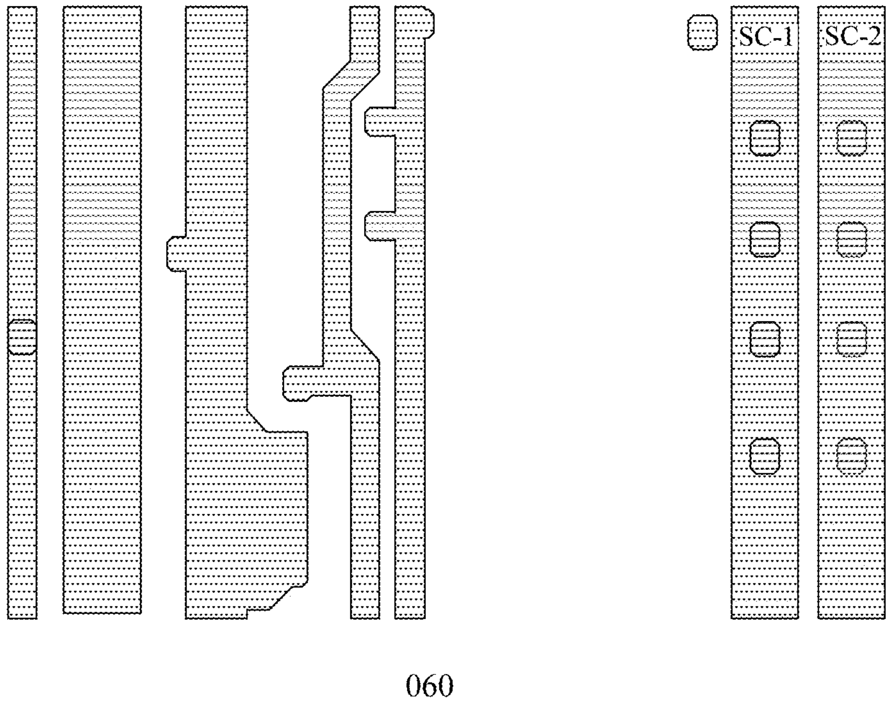
FIG. 20 is a schematic diagram of the layout structure of the auxiliary wiring layer provided by an embodiment of the present disclosure.

In some embodiments of the present disclosure, as shown in FIG. 14, a plurality of clock signal lines clk1 and clk2 are disposed on a side of a gate driving circuit coupled thereto that is away from the display area.

In some embodiments of the present disclosure, as shown in FIG. 14, the orthographic projections of the output control signal lines (such as CS-1, CS-2) on the base substrate are arranged between the orthographic projections of the clock signal lines (such as clk1, clk2) on the base substrate and the display area.

In some embodiments of the present disclosure, as shown in FIG. 14, the orthographic projection of the gate driving circuit 10 on the base substrate is arranged between the orthographic projections of the clock signal lines (such as clk1, clk2) on the base substrate and the orthographic projections of the output control signal lines (such as CS-1, CS-2) on the base substrate. The orthographic projections of the output control signal lines (such as CS-1, CS-2) on the base substrate are arranged between the orthographic projection of the gate driving circuit 10 on the base substrate and the display area.

In some embodiments of the present disclosure, as shown in FIG. 14, the orthographic projection of the first output transistor on the base substrate is located between the orthographic projection of the first cascade transistor on the base substrate and the display area.

In some embodiments of the present disclosure, as shown in FIG. 14, a width of a channel of the first output transistor is greater than a width of a channel of the first cascade transistor.

In some embodiments of the present disclosure, the width of the channel of the first output transistor is not less than 100 μm.

In some embodiments of the present disclosure, the width of the channel of the first cascade transistor is no greater than 60 μm.

In some embodiments of the present disclosure, as shown in FIG. 14, the orthographic projection of the second output transistor on the base substrate is located between the orthographic projection of the second cascade transistor on the base substrate and the display area.

In some embodiments of the present disclosure, as shown in FIG. 14, the width of the channel of the second output transistor is greater than the width of the channel of the second cascade transistor.

In some embodiments of the present disclosure, the width of the channel of the second output transistor is not less than 100 μm.

In some embodiments of the present disclosure, the width of the channel of the second cascade transistor is no greater than 60 μm.

Figure 4:
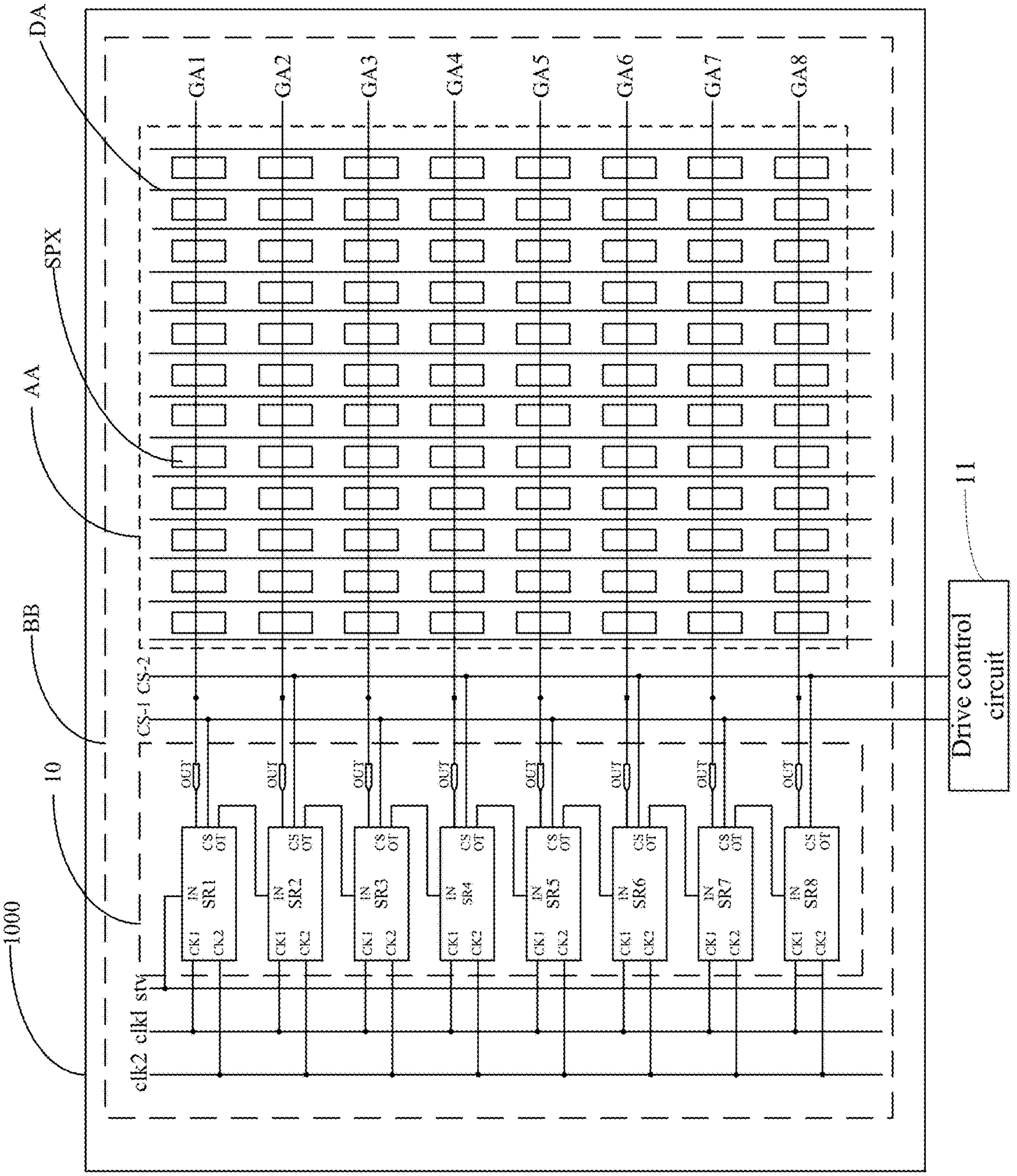
FIG. 4 is a schematic diagram of some structures of a display device provided by an embodiment of the present disclosure.

The embodiment of the present disclosure provides a display device, as shown in FIG. 4, including the display panel described above;

- the drive control circuit 11 coupled to the display panel and configured to input a first output control signal to an output control signal terminal CS of a plurality of shift register units (e.g., SR1, SR2, SR3, SR4, SR5, SR6, SR7, and SR8 in FIG. 4) when determining to adopt the full-screen driving mode, so that the plurality of shift register units (e.g., SR1, SR2, SR3, SR4, SR5, SR6, SR7, and SR8 in FIG. 4) sequentially output gate scanning signals to drive the scanning lines row by row;
- when determining to adopt the local driving mode, input a second output control signal to the output control signal terminal CS of the plurality of shift register units (e.g., SR1, SR2, SR3, SR4, SR5, SR6, SR7, and SR8 in FIG. 4), so that some of the shift register units in the plurality of shift register units sequentially output gate scanning signals, and the remaining shift register units output invalid scanning signals. Exemplarily, the second output control signal is input to the output control signal terminal CS of the plurality of shift register units SR1, SR2, SR3, SR4, SR5, SR6, SR7, and SR8, so that the shift register units SR1, SR2, SR6, SR7, and SR8 sequentially output gate scanning signals, and the remaining shift register units SR3, SR4, and SR5 output invalid scanning signals.

Exemplarily, the gate scanning signal is a high-level signal, and the invalid scanning signal is a low-level signal. Alternatively, the gate scanning signal is a low-level signal, and the invalid scanning signal is a high-level signal, which is not limited here.

Figure 5:
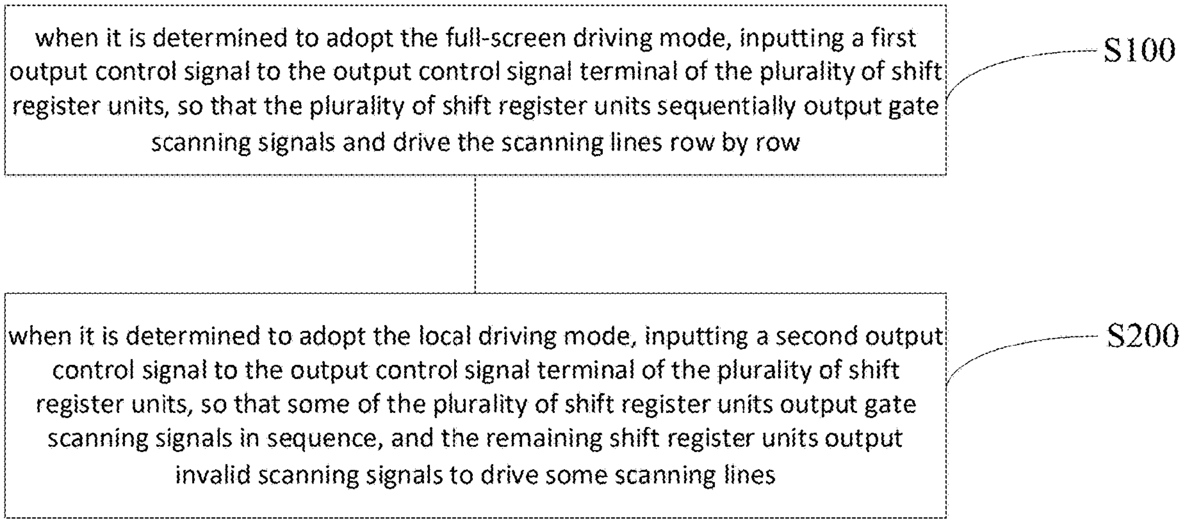
FIG. 5 is a flow chart of a drive control method provided by an embodiment of the present disclosure.

The embodiment of the present disclosure provides a driving control method, as shown in FIG. 5, including:

- S100, when it is determined to adopt the full-screen driving mode, inputting a first output control signal to the output control signal terminal of the plurality of shift register units, so that the plurality of shift register units sequentially output gate scanning signals and drive the scanning lines row by row;
- S200, when it is determined to adopt the local driving mode, inputting a second output control signal to the output control signal terminal of the plurality of shift register units, so that some of the plurality of shift register units output gate scanning signals in sequence, and the remaining shift register units output invalid scanning signals to drive some scanning lines.

Figure 6:
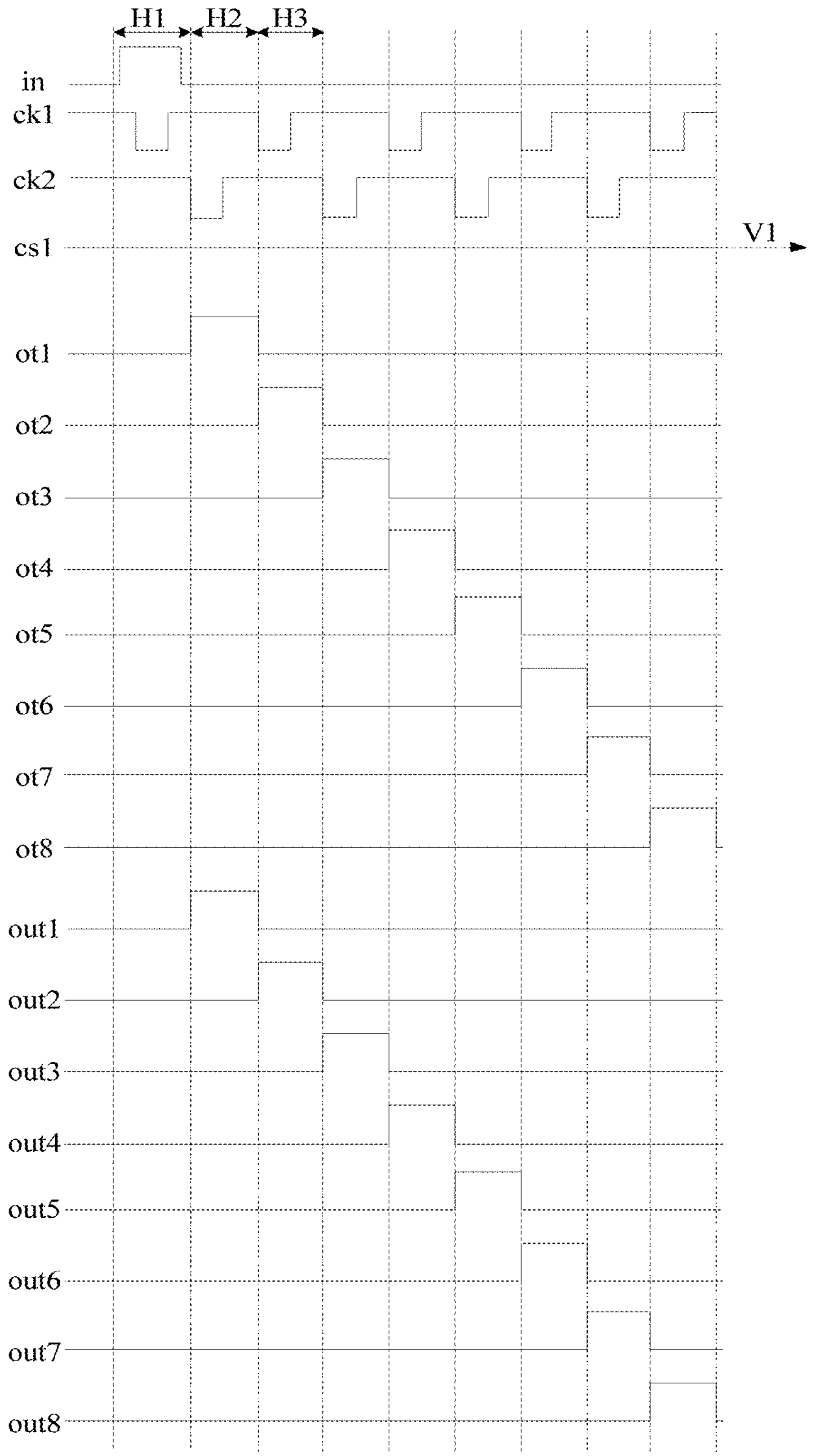
FIG. 6 is a timing diagram of some signals provided by an embodiment of the present disclosure.

In some embodiments of the present disclosure, as shown in FIG. 6, the first output control signal cs1 is a fixed voltage signal with a first level V1. Exemplarily, the fixed voltage signal of the first level V1 is a high level, or the fixed voltage signal of the first level V1 is a low level, which is not limited here.

Exemplarily, in the full-screen driving mode, the first output control signal cs1 is input to the output control signal terminals of the plurality of shift register units through the first output control signal line CS-1 and the second output control signal line CS-2. The signal timing diagram of the gate scanning signals out1 to out8 loaded by the scanning lines (e.g., GA1, GA2, GA3, GA4, GA5, GA6, GA7, GA8 in FIG. 4) is shown in FIG. 6.

As shown in FIG. 6, in represents the input signal of the input signal terminal IN, ck1 represents the first clock signal of the first clock signal terminal CK1, ck2 represents the second clock signal of the second clock signal terminal CK2, cs1 represents the first output control signal of the output control signal terminal CS, ot1 represents the cascade signal of the cascade signal terminal OT in the first shift register unit SR1, ot2 represents the cascade signal of the cascade signal terminal OT in the second shift register unit SR2, ot3 represents the cascade signal of the cascade signal terminal OT in the third shift register unit SR3, ot4 represents the cascade signal of the cascade signal terminal OT in the fourth shift register unit SR4, ot5 represents the cascade signal of the cascade signal terminal OT in the fifth shift register unit SR5, ot6 represents the cascade signal of the cascade signal terminal OT in the sixth shift register unit SR6, ot7 represents the cascade signal of the cascade signal terminal OT in the seventh shift register unit SR7, and ot8 represents the cascade signal of the cascade signal terminal OT in the eighth shift register unit SR8, out1 represents the gate scanning signal of the driving output terminal OUT in the first shift register unit SR1, out2 represents the gate scanning signal of the driving output terminal OUT in the second shift register unit SR2, out3 represents the gate scanning signal of the driving output terminal OUT in the third shift register unit SR3, out4 represents the gate scanning signal of the driving output terminal OUT in the fourth shift register unit SR4, out5 represents the gate scanning signal of the driving output terminal OUT in the fifth shift register unit SR5, out6 represents the gate scanning signal of the driving output terminal OUT in the sixth shift register unit SR6, out7 represents the gate scanning signal of the driving output terminal OUT in the seventh shift register unit SR7, and out8 represents the gate scanning signal of the driving output terminal OUT in the eighth shift register unit SR8.

The following takes the shift register unit structure shown in FIG. 2 as an example and describes the working process of the shift register unit provided by the embodiments of the present disclosure in combination with the signal timing diagram shown in FIG. 6.

As shown in FIG. 2, all transistors are P-type transistors, the effective pulse signal of the first reference signal output by the first reference signal terminal VREF1 is a low-level signal, the effective pulse signal of the second reference signal output by the second reference signal terminal VREF2 is a low-level signal, the effective pulse signal of the third reference signal output by the third reference signal terminal VREF3 is a high-level signal, the effective pulse signal of the fourth reference signal output by the fourth reference signal terminal VREF4 is a high-level signal, the effective pulse signal of the fifth reference signal output by the fifth reference signal terminal VREF5 is a high-level signal, and the fixed voltage signal of the first level V1 of the first output control signal cs1 is a high-level signal.

Since the gates of the third transistor M3 and the seventh transistor M7 are coupled to the second reference voltage signal terminal VREF2, the second reference voltage signal terminal VREF2 inputs a low level signal, and the gates of the fourteenth transistor M14 and the fifteenth transistor M15 are coupled to the first reference voltage signal terminal VREF1, the first reference voltage signal terminal VREF1 inputs a low level signal, so the third transistor M3, the seventh transistor M7, the fourteenth transistor M14 and the fifteenth transistor M15 are in a normally on state. Since the gate of the thirteenth transistor M13 is coupled to the fifth reference voltage signal terminal VREF5, the fifth reference voltage signal terminal VREF5 inputs a high level signal, so the thirteenth transistor M13 is in a normally off state. For ease of description, the following will no longer analyze the states of the third transistor M3, the seventh transistor M7, the thirteenth transistor M13, the fourteenth transistor M14 and the fifteenth transistor M15 at any time.

In the first phase H1, the input signal in provides a high level, the first clock signal ck1 provides a low level, and the second clock signal ck2 provides a high level. Then the first transistor M1 is turned on under the control of the low level of the first clock signal ck1, and the first transistor M1 provides the high level of the input signal in to the third node N3. The second transistor M2 is turned off under the control of the high level of the third node N3. The twelfth transistor M12 is turned off under the control of the high level of the third node N3. The fifteenth transistor M15 provides the high level of the third node N3 to the second node N2, and the second cascade transistor T4 and the second output transistor T2 are turned off. The ninth transistor M9 is turned on under the control of the low level of the first clock signal ck1, and the ninth transistor M9 provides the low level of the second reference signal terminal VREF2 to the fourth node N4, and the tenth transistor M10 is turned on under the control of the low level of the fourth node N4, and the tenth transistor M10 provides the high level of the third reference signal terminal VREF3 to the sixth node N6. The third transistor M3 provides the low level of the fourth node N4 to the gate of the fourth transistor M4, then the fourth transistor M4 is turned on, the fourth transistor M4 provides the high level of the second clock signal ck2 to the first electrode of the fifth transistor M5, and the fifth transistor M5 is turned off under the control of the high level of the second clock signal ck2. Then the first cascade transistor T3 and the first output transistor T1 are turned off. The sixth transistor M6 is turned on under the control of the low level of the first clock signal ck1, the sixth transistor M6 and the seventh transistor M7 provide the high level of the input signal in to the fifth node N5, then the eighth transistor M8 and the eleventh transistor M11 are turned off under the control of the high level of the fifth node N5. The cascade signal output by the cascade signal terminal OT is maintained at a low level, and the gate scanning signal output by the driving output terminal OUT is maintained at a low level.

In the second stage H2, the input signal in provides a low level, the first clock signal ck1 provides a high level, and the second clock signal ck2 provides a low level. The first transistor M1 is turned off under the control of the high level of the first clock signal ck1, the third node N3 is maintained at a high level, and the second transistor M2 is turned off under the control of the high level of the third node N3. The twelfth transistor M12 is turned off under the control of the high level of the third node N3. The fifteenth transistor M15 provides the high level of the third node N3 to the second node N2, and the second cascade transistor T4 and the second output transistor T2 are turned off. The ninth transistor M9 is turned off under the control of the high level of the first clock signal ck1, the fourth node N4 is maintained at a low level, the tenth transistor M10 is turned on under the control of the low level of the fourth node N4, and the tenth transistor M10 provides the high level of the third reference signal terminal VREF3 to the sixth node N6. The third transistor M3 provides the low level of the fourth node N4 to the gate of the fourth transistor M4, then the fourth transistor M4 is turned on, the fourth transistor M4 provides the low level of the second clock signal ck2 to the first electrode of the fifth transistor M5, the fifth transistor M5 is turned on under the control of the low level of the second clock signal ck2, the fifth transistor M5 provides the low level of the first electrode to the first node N1, then the first cascade transistor T3 and the first output transistor T1 are turned on under the control of the low level of the first node N1. The first cascade transistor T3 provides the high level of the fourth reference signal terminal VREF4 to the cascade signal terminal OT. The first output transistor T1 provides the high level of the first output control signal cs1 of the output control signal terminal CS to the driving output terminal OUT. The sixth transistor M6 is turned off under the control of the high level of the first clock signal ck1, the fifth node N5 maintains a high level, then the eighth transistor M8 and the eleventh transistor M11 are turned off under the control of the high level of the fifth node N5. The cascade signal output by the cascade signal terminal OT is maintained at a low level, and the gate scanning signal output by the driving output terminal OUT is maintained at a low level. The cascade signal outputted by the cascade signal terminal OT is at a high level, and the gate scanning signal outputted by the driving output terminal OUT is at a high level.

In the third stage H3, the input signal in provides a low level, the first clock signal ck1 provides a low level, and the second clock signal ck2 provides a high level. Then the first transistor M1 is turned on under the control of the low level of the first clock signal ck1, and the first transistor M1 provides the low level of the input signal in to the third node N3. The second transistor M2 is turned on under the control of the low level of the third node N3, and the second transistor M2 provides the low level of the first clock signal ck1 to the fourth node N4. The twelfth transistor M12 is turned on under the control of the low level of the third node N3, and the twelfth transistor M12 provides the high level of the fourth reference signal terminal VREF4 to the first node N1. Then the first cascade transistor T3 and the first output transistor T1 are turned off. The fifteenth transistor M15 provides the low level of the third node N3 to the second node N2, then the second cascade transistor T4 and the second output transistor T2 are turned on under the control of the low level of the second node N2, then the second cascade transistor T4 provides the low level of the first reference signal terminal VREF1 to the cascade signal terminal OT, and the second output transistor T2 provides the low level of the first reference signal terminal VREF1 to the driving output terminal OUT. The ninth transistor M9 is turned on under the control of the low level of the first clock signal ck1, and the ninth transistor M9 provides the low level of the second reference signal terminal VREF2 to the fourth node N4, the tenth transistor M10 is turned on under the control of the low level of the fourth node N4, and the tenth transistor M10 provides the high level of the third reference signal terminal VREF3 to the sixth node N6. The third transistor M3 provides the low level of the fourth node N4 to the gate of the fourth transistor M4, then the fourth transistor M4 is turned on, the fourth transistor M4 provides the high level of the second clock signal ck2 to the first electrode of the fifth transistor M5, the fifth transistor M5 is turned off under the control of the high level of the second clock signal ck2, then the first cascade transistor T3 and the first output transistor T1 are turned off under the control of the high level of the first node N1. The sixth transistor M6 is turned on under the control of the low level of the first clock signal ck1, the sixth transistor M6 and the seventh transistor M7 provide the low level of the input signal in to the fifth node N5, then the eighth transistor M8 and the eleventh transistor M11 are turned on under the control of the low level of the fifth node N5. The eighth transistor M8 provides the low level of the fifth node N5 to the second node N2, and the eleventh transistor M11 provides the high level of the second clock signal ck2 to the sixth node N6. The cascade signal output by the cascade signal terminal OT is maintained at a low level, and the gate scanning signal output by the driving output terminal OUT is maintained at a low level. The cascade signal outputted by the cascade signal terminal OT is at a low level, and the gate scanning signal outputted by the driving output terminal OUT is at a low level.

In the subsequent time period, the shift register unit will repeat the working process of the above-mentioned stages H1 to H3.

Figure 7:
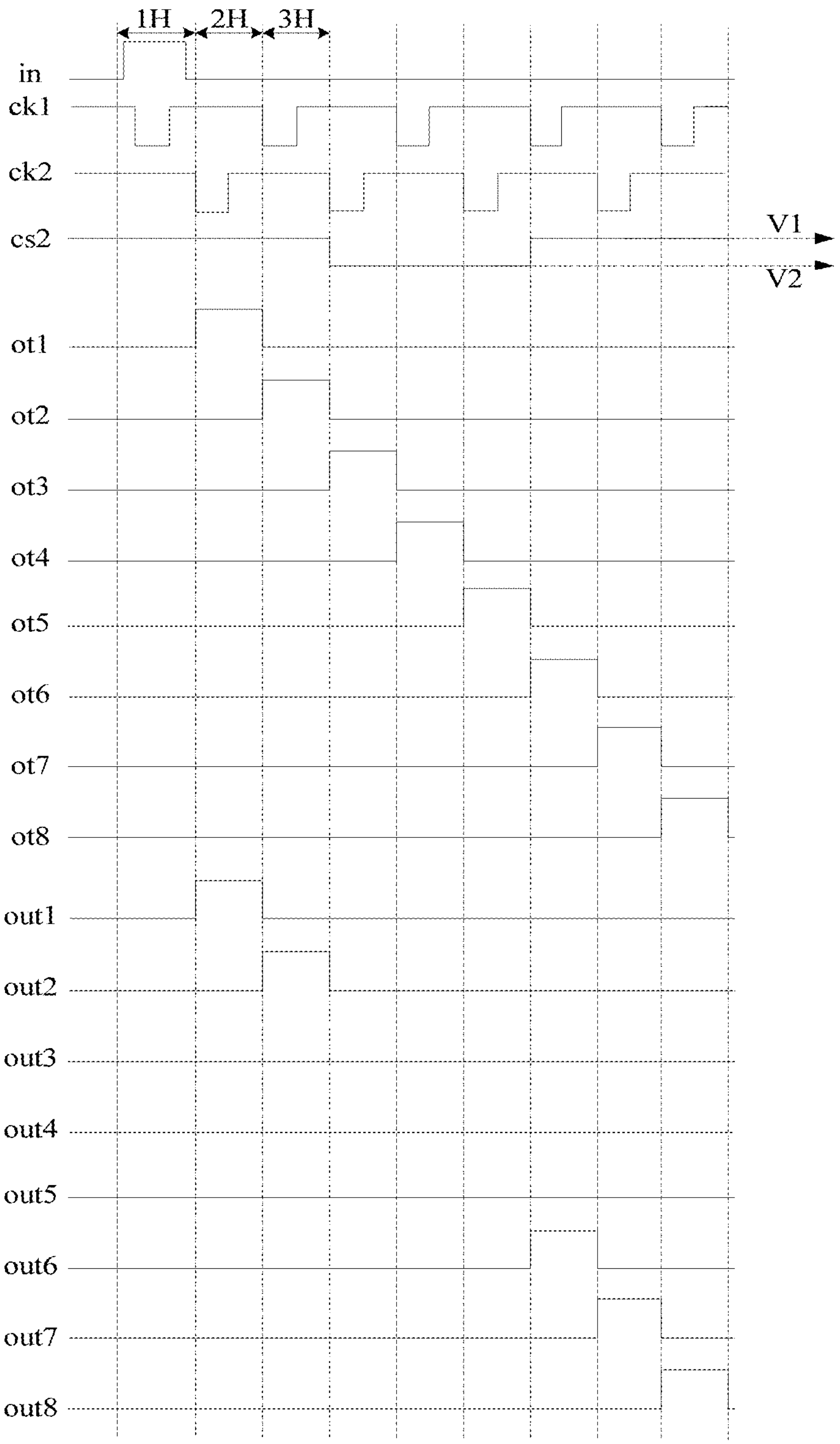
FIG. 7 is a timing diagram of some further signals provided by an embodiment of the present disclosure.

In some embodiments of the present disclosure, as shown in FIG. 7, the second output control signal cs2 includes a fixed voltage signal portion with a first level V1 and a fixed voltage signal portion with a second level V2. The fixed voltage signal portion with the first level V1 is input to some shift register units, and the fixed voltage signal portion with the second level V2 is input to the remaining shift register units.

Exemplarily, the fixed voltage signal portion with the first level V1 of the second output control signal cs2 is input into the shift register units SR1, SR2, SR6, SR7, and SR8, and the fixed voltage signal portion with the second level V2 of the second output control signal cs2 is input into the shift register units SR3, SR4, and SR5.

Exemplarily, in the local driving mode, the second output control signal cs2 is input to the output control signal terminals of the plurality of shift register units through the first output control signal line CS-1 and the second output control signal line CS-2. The signal timing diagram of the gate scanning signals out1 to out8 loaded by the scanning lines (e.g., GA1, GA2, GA3, GA4, GA5, GA6, GA7, GA8 in FIG. 4) is shown in FIG. 7.

As shown in FIG. 7, in represents the input signal of the input signal terminal IN, ck1 represents the first clock signal of the first clock signal terminal CK1, ck2 represents the second clock signal of the second clock signal terminal CK2, cs2 represents the second output control signal of the output control signal terminal CS, ot1 represents the cascade signal of the cascade signal terminal OT in the first shift register unit SR1, ot2 represents the cascade signal of the cascade signal terminal OT in the second shift register unit SR2, ot3 represents the cascade signal of the cascade signal terminal OT in the third shift register unit SR3, ot4 represents the cascade signal of the cascade signal terminal OT in the fourth shift register unit SR4, ot5 represents the cascade signal of the cascade signal terminal OT in the fifth shift register unit SR5, ot6 represents the cascade signal of the cascade signal terminal OT in the sixth shift register unit SR6, ot7 represents the cascade signal of the cascade signal terminal OT in the seventh shift register unit SR7, and ot8 represents the cascade signal of the cascade signal terminal OT in the eighth shift register unit SR8, out1 represents the gate scanning signal of the driving output terminal OUT in the first shift register unit SR1, out2 represents the gate scanning signal of the driving output terminal OUT in the second shift register unit SR2, out3 represents the gate scanning signal of the driving output terminal OUT in the third shift register unit SR3, out4 represents the gate scanning signal of the driving output terminal OUT in the fourth shift register unit SR4, out5 represents the gate scanning signal of the driving output terminal OUT in the fifth shift register unit SR5, out6 represents the gate scanning signal of the driving output terminal OUT in the sixth shift register unit SR6, out7 represents the gate scanning signal of the driving output terminal OUT in the seventh shift register unit SR7, and out8 represents the gate scanning signal of the driving output terminal OUT in the eighth shift register unit SR8.

The following takes the shift register unit structure shown in FIG. 2 as an example and describes the working process of the shift register unit provided by the embodiments of the present disclosure in combination with the signal timing diagram shown in FIG. 7.

As shown in FIG. 2, all transistors are P-type transistors, the effective pulse signal of the first reference signal output by the first reference signal terminal VREF1 is a low-level signal, the effective pulse signal of the second reference signal output by the second reference signal terminal VREF2 is a low-level signal, the effective pulse signal of the third reference signal output by the third reference signal terminal VREF3 is a high-level signal, the effective pulse signal of the fourth reference signal output by the fourth reference signal terminal VREF4 is a high-level signal, the effective pulse signal of the fifth reference signal output by the fifth reference signal terminal VREF5 is a high-level signal, a fixed voltage signal portion with the first level V1 of the second output control signal cs2 is a high-level signal, and a fixed voltage signal portion with the second level V2 of the second output control signal cs2 is a low-level signal.

Since the gates of the third transistor M3 and the seventh transistor M7 are coupled to the second reference voltage signal terminal VREF2, the second reference voltage signal terminal VREF2 inputs a low level signal, and the gates of the fourteenth transistor M14 and the fifteenth transistor M15 are coupled to the first reference voltage signal terminal VREF1, the first reference voltage signal terminal VREF1 inputs a low level signal, so the third transistor M3, the seventh transistor M7, the fourteenth transistor M14 and the fifteenth transistor M15 are in a normally on state. Since the gate of the thirteenth transistor M13 is coupled to the fifth reference voltage signal terminal VREF5, the fifth reference voltage signal terminal VREF5 inputs a high level signal, so the thirteenth transistor M13 is in a normally off state. For ease of description, the following will no longer analyze the states of the third transistor M3, the seventh transistor M7, the thirteenth transistor M13, the fourteenth transistor M14 and the fifteenth transistor M15 at any time.

In the first phase H1, the input signal in provides a high level, the first clock signal ck1 provides a low level, and the second clock signal ck2 provides a high level. Then the first transistor M1 is turned on under the control of the low level of the first clock signal ck1, and the first transistor M1 provides the high level of the input signal in to the third node N3. The second transistor M2 is turned off under the control of the high level of the third node N3. The twelfth transistor M12 is turned off under the control of the high level of the third node N3. The fifteenth transistor M15 provides the high level of the third node N3 to the second node N2, and the second cascade transistor T4 and the second output transistor T2 are turned off. The ninth transistor M9 is turned on under the control of the low level of the first clock signal ck1, and the ninth transistor M9 provides the low level of the second reference signal terminal VREF2 to the fourth node N4, and the tenth transistor M10 is turned on under the control of the low level of the fourth node N4, and the tenth transistor M10 provides the high level of the third reference signal terminal VREF3 to the sixth node N6. The third transistor M3 provides the low level of the fourth node N4 to the gate of the fourth transistor M4, then the fourth transistor M4 is turned on, the fourth transistor M4 provides the high level of the second clock signal ck2 to the first electrode of the fifth transistor M5, and the fifth transistor M5 is turned off under the control of the high level of the second clock signal ck2. Then the first cascade transistor T3 and the first output transistor T1 are turned off. The sixth transistor M6 is turned on under the control of the low level of the first clock signal ck1, the sixth transistor M6 and the seventh transistor M7 provide the high level of the input signal in to the fifth node N5, then the eighth transistor M8 and the eleventh transistor M11 are turned off under the control of the high level of the fifth node N5. The cascade signal output by the cascade signal terminal OT is maintained at a low level, and the gate scanning signal output by the driving output terminal OUT is maintained at a low level.

In the second stage H2, the input signal in provides a low level, the first clock signal ck1 provides a high level, and the second clock signal ck2 provides a low level. The first transistor M1 is turned off under the control of the high level of the first clock signal ck1, the third node N3 is maintained at a high level, and the second transistor M2 is turned off under the control of the high level of the third node N3. The twelfth transistor M12 is turned off under the control of the high level of the third node N3. The fifteenth transistor M15 provides the high level of the third node N3 to the second node N2, and the second cascade transistor T4 and the second output transistor T2 are turned off. The ninth transistor M9 is turned off under the control of the high level of the first clock signal ck1, the fourth node N4 is maintained at a low level, the tenth transistor M10 is turned on under the control of the low level of the fourth node N4, and the tenth transistor M10 provides the high level of the third reference signal terminal VREF3 to the sixth node N6. The third transistor M3 provides the low level of the fourth node N4 to the gate of the fourth transistor M4, then the fourth transistor M4 is turned on, the fourth transistor M4 provides the low level of the second clock signal ck2 to the first electrode of the fifth transistor M5, the fifth transistor M5 is turned on under the control of the low level of the second clock signal ck2, the fifth transistor M5 provides the low level of the first electrode to the first node N1, then the first cascade transistor T3 and the first output transistor T1 are turned on under the control of the low level of the first node N1. The first cascade transistor T3 provides the high level of the fourth reference signal terminal VREF4 to the cascade signal terminal OT. The first output transistor T1 provides the high level of the first output control signal cs1 of the output control signal terminal CS to the driving output terminal OUT. The sixth transistor M6 is turned off under the control of the high level of the first clock signal ck1, the fifth node N5 maintains a high level, then the eighth transistor M8 and the eleventh transistor M11 are turned off under the control of the high level of the fifth node N5. The cascade signal output by the cascade signal terminal OT is maintained at a low level, and the gate scanning signal output by the driving output terminal OUT is maintained at a low level. The cascade signal outputted by the cascade signal terminal OT is at a high level, and the gate scanning signal outputted by the driving output terminal OUT is at a high level.

In the third stage H3, the input signal in provides a low level, the first clock signal ck1 provides a low level, and the second clock signal ck2 provides a high level. Then the first transistor M1 is turned on under the control of the low level of the first clock signal ck1, and the first transistor M1 provides the low level of the input signal in to the third node N3. The second transistor M2 is turned on under the control of the low level of the third node N3, and the second transistor M2 provides the low level of the first clock signal ck1 to the fourth node N4. The twelfth transistor M12 is turned on under the control of the low level of the third node N3, and the twelfth transistor M12 provides the high level of the fourth reference signal terminal VREF4 to the first node N1. Then the first cascade transistor T3 and the first output transistor T1 are turned off. The fifteenth transistor M15 provides the low level of the third node N3 to the second node N2, then the second cascade transistor T4 and the second output transistor T2 are turned on under the control of the low level of the second node N2, then the second cascade transistor T4 provides the low level of the first reference signal terminal VREF1 to the cascade signal terminal OT, and the second output transistor T2 provides the low level of the first reference signal terminal VREF1 to the driving output terminal OUT. The ninth transistor M9 is turned on under the control of the low level of the first clock signal ck1, and the ninth transistor M9 provides the low level of the second reference signal terminal VREF2 to the fourth node N4, the tenth transistor M10 is turned on under the control of the low level of the fourth node N4, and the tenth transistor M10 provides the high level of the third reference signal terminal VREF3 to the sixth node N6. The third transistor M3 provides the low level of the fourth node N4 to the gate of the fourth transistor M4, then the fourth transistor M4 is turned on, the fourth transistor M4 provides the high level of the second clock signal ck2 to the first electrode of the fifth transistor M5, the fifth transistor M5 is turned off under the control of the high level of the second clock signal ck2, then the first cascade transistor T3 and the first output transistor T1 are turned off under the control of the high level of the first node N1. The sixth transistor M6 is turned on under the control of the low level of the first clock signal ck1, the sixth transistor M6 and the seventh transistor M7 provide the low level of the input signal in to the fifth node N5, then the eighth transistor M8 and the eleventh transistor M11 are turned on under the control of the low level of the fifth node N5. The eighth transistor M8 provides the low level of the fifth node N5 to the second node N2, and the eleventh transistor M11 provides the high level of the second clock signal ck2 to the sixth node N6. The cascade signal output by the cascade signal terminal OT is maintained at a low level, and the gate scanning signal output by the driving output terminal OUT is maintained at a low level. The cascade signal outputted by the cascade signal terminal OT is at a low level, and the gate scanning signal outputted by the driving output terminal OUT is at a low level.

In the subsequent time period, the shift register unit will repeat the working process of the above-mentioned stages H1 to H3.

In the embodiments of the present disclosure, the signal at the output control signal terminal is controlled to control the gate scanning signal at the driving output terminal in the output circuit, thereby controlling any area of the display panel to be scanned, and controlling any area of the display panel not to be scanned, thereby saving power consumption and reducing losses.

Figure 8:
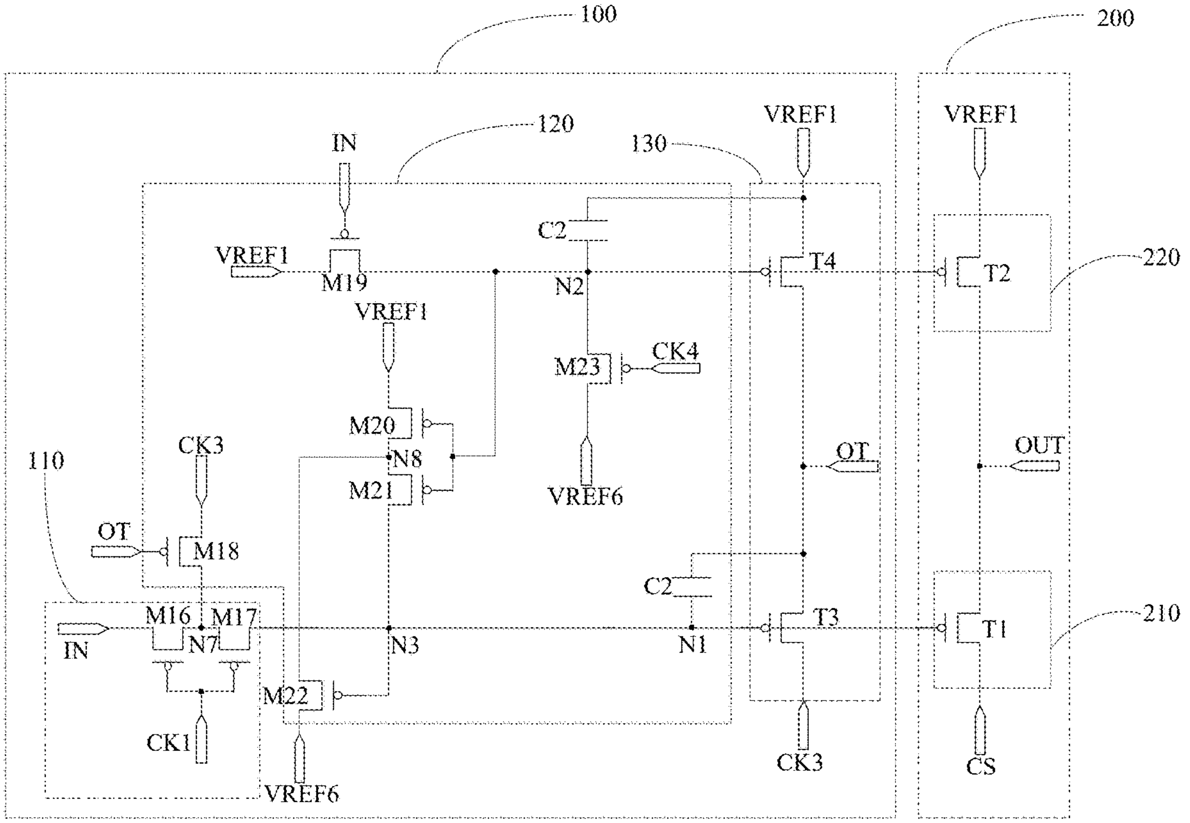
FIG. 8 is a schematic diagram of some further structures of a shift register unit provided by an embodiment of the present disclosure.

Some embodiments of the present disclosure further provide another structural diagram of a shift register unit, as shown in FIG. 8, which is a modification of the implementation in the above embodiments. The following only describes the differences between this embodiment and the above embodiments, and the similarities are not repeated here.

In some other embodiments of the present disclosure, as shown in FIG. 8, the input subcircuit 110 includes: a sixteenth transistor M16 and a seventeenth transistor M17. The gate of the sixteenth transistor M16 is coupled to the first clock signal terminal CK1, the first electrode of the sixteenth transistor M16 is coupled to the input signal terminal IN, and the second electrode of the sixteenth transistor M16 is coupled to the seventh node N7. The gate of the seventeenth transistor M17 is coupled to the first clock signal terminal CK1, the first electrode of the seventeenth transistor M17 is coupled to the seventh node N7, and the second electrode of the seventeenth transistor M17 is coupled to the third node N3.

In some other embodiments of the present disclosure, as shown in FIG. 8, the control subcircuit 120 includes: an eighteenth transistor M18, a nineteenth transistor M19, a twentieth transistor M20, a twenty-first transistor M21, a twenty-second transistor M22, a twenty-third transistor M23, a fifth capacitor C5, and a sixth capacitor C6. The gate of the eighteenth transistor M18 is coupled to the cascade output terminal OT, the first electrode of the eighteenth transistor M18 is coupled to the third clock signal terminal CK3, and the second electrode of the eighteenth transistor M18 is coupled to the seventh node N7. The gate of the nineteenth transistor M19 is coupled to the input signal terminal IN, the first electrode of the nineteenth transistor M19 is coupled to the first reference signal terminal VREF1, and the second electrode of the nineteenth transistor M19 is coupled to the second node N2. The gate of the twentieth transistor M20 is coupled to the second node N2, the first electrode of the twentieth transistor M20 is coupled to first reference signal terminal VREF1, the second electrode of the twentieth transistor M20 is coupled to the eighth node N8. The gate of the twenty-first transistor M21 is coupled to the second node N2, the first electrode of the twenty-first transistor M21 is coupled to the eighth node N8, and the second electrode of the twenty-first transistor M21 is coupled to the third node N3. The gate of the twenty-second transistor M22 is coupled to the third node N3, the first electrode of the twenty-second transistor M22 is coupled to the eighth node N8, and the second electrode of the twenty-second transistor M22 is coupled to the sixth reference signal terminal VREF6. The gate of the twenty-third transistor M23 is coupled to the fourth clock signal terminal CK4, the first electrode of the twenty-third transistor M23 is coupled to the second node N2, and the second electrode of the twenty-third transistor M23 is coupled to the sixth reference signal terminal VREF6. The first electrode of the fifth capacitor C5 is coupled to the first reference signal terminal VREF1, and the second electrode of the fifth capacitor C5 is coupled to the first electrode of the twenty-third transistor M23. The first electrode of the sixth capacitor C6 is coupled to the cascade output terminal OT, and the second electrode of the sixth capacitor C6 is coupled to the first node N1.

In some other embodiments of the present disclosure, as shown in FIG. 8, the cascade subcircuit 130 includes: a first cascade transistor T3 and a second cascade transistor T4. The gate of the first cascade transistor T3 is coupled to the first node N1, the first electrode of the first cascade transistor T3 is coupled to the cascade output terminal OT, and the second electrode of the first cascade transistor T3 is coupled to the third clock signal terminal CK3. The gate of the second cascade transistor T4 is coupled to the second node N2, the first electrode of the second cascade transistor T4 is coupled to the first reference signal terminal VREF1, and the second electrode of the second cascade transistor T4 is coupled to the cascade output terminal OT.

Figure 9:
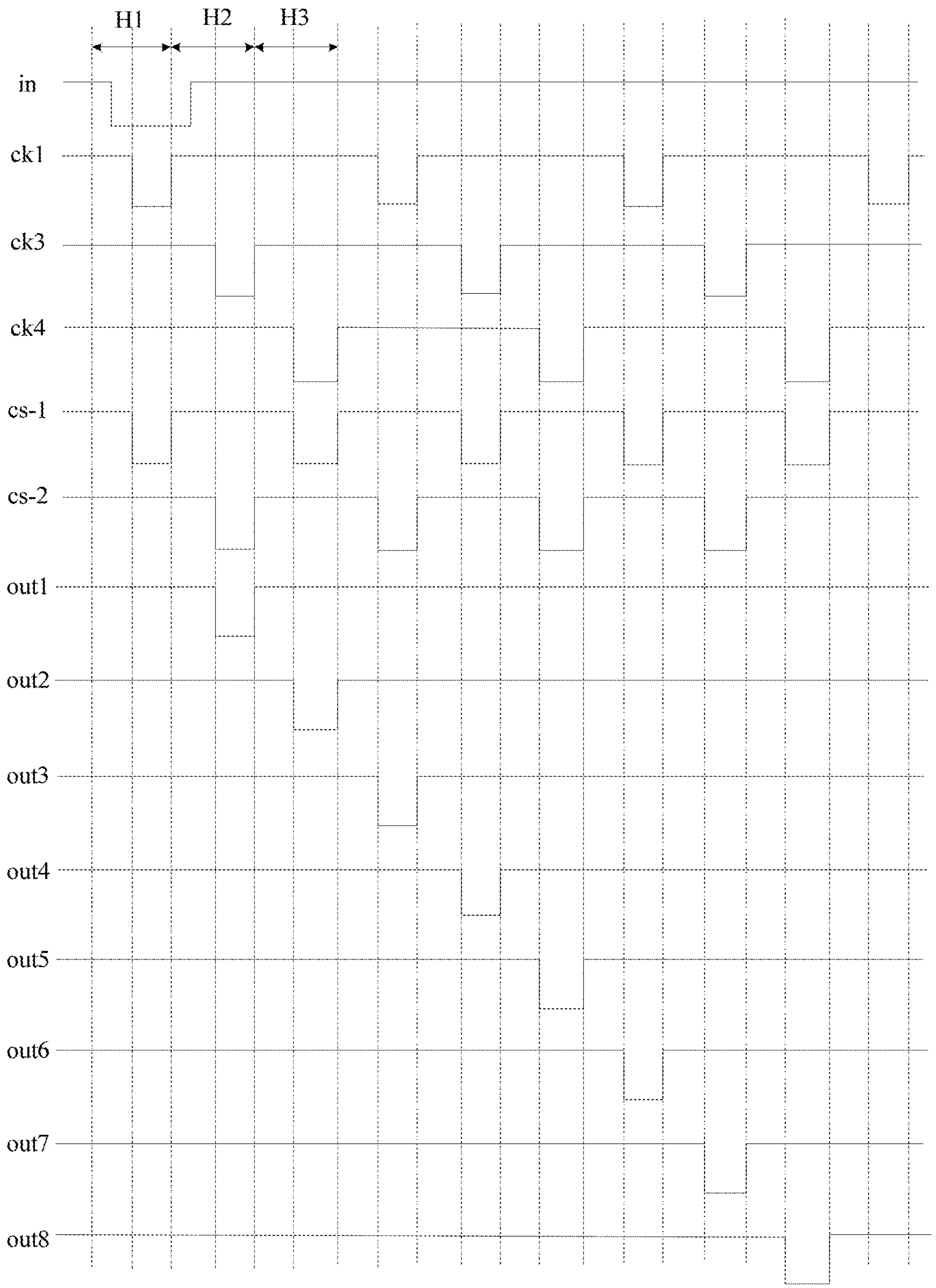
FIG. 9 is a timing diagram of some further signals provided by an embodiment of the present disclosure.

In some other embodiments of the present disclosure, as shown in FIG. 9, the first output control signals cs-1 and cs-2 are clock signals.

Exemplarily, in full-screen driving mode, the first output control signals cs-1 and cs-2 are respectively input to the output control signal terminals of the plurality of shift register units through the first output control signal line CS-1 and the second output control signal line CS-2. The signal timing diagram of the gate scanning signals out1 to out8 loaded by the scanning lines (e.g., GA1, GA2, GA3, GA4, GA5, GA6, GA7, GA8 in FIG. 4) is shown in FIG. 9.

As shown in FIG. 9, in represents the input signal of the input signal terminal IN, ck1 represents the first clock signal of the first clock signal terminal CK1, ck3 represents the third clock signal of the third clock signal terminal CK3, ck4 represents the fourth clock signal of the fourth clock signal terminal CK4, cs-1 represents the first output control signal on the first output control signal line CS-1, cs-2 represents the first output control signal on the second output control signal line CS-2, out1 represents the gate scanning signal of the driving output terminal OUT in the first shift register unit SR1, and out2 represents the gate scanning signal of the driving output terminal OUT in the second shift register unit SR2, out3 represents the gate scanning signal of the driving output terminal OUT in the third shift register unit SR3, out4 represents the gate scanning signal of the driving output terminal OUT in the fourth shift register unit SR4, out5 represents the gate scanning signal of the driving output terminal OUT in the fifth shift register unit SR5, out6 represents the gate scanning signal of the driving output terminal OUT in the sixth shift register unit SR6, out7 represents the gate scanning signal of the driving output terminal OUT in the seventh shift register unit SR7, and out8 represents the gate scanning signal of the driving output terminal OUT in the eighth shift register unit SR8.

The following takes the shift register unit structure shown in FIG. 8 as an example and describes the working process of the shift register unit provided by the embodiments of the present disclosure in combination with the signal timing diagram shown in FIG. 9.

As shown in FIG. 8, an example is given in which all transistors are P-type transistors, the valid pulse signal of the first reference signal outputted by the first reference signal terminal VREF1 is a high level signal, and the valid pulse signal of the sixth reference signal outputted by the sixth reference signal terminal VREF6 is a low level signal.

In the first phase H1, the input signal in provides a low level, the first clock signal ck1 provides a low level, the third clock signal ck3 provides a high level, the fourth clock signal ck4 provides a high level, the first output control signal cs-1 on the first output control signal line CS-1 provides a low level, and the first output control signal cs-2 on the second output control signal line CS-2 provides a high level. The sixteenth transistor M16 is turned on under the control of the low level of the first clock signal ck1, and the sixteenth transistor M16 provides the low level of the input signal in to the seventh node N7. The seventeenth transistor M17 is turned on under the control of the low level of the first clock signal ck1, and the sixteenth transistor M16 provides the low level of the seventh node N7 to the third node N3 and the first node N1. The twenty-second transistor M22 is turned on under the control of the low level of the third node N3, and the twenty-second transistor M22 provides the low level of the sixth reference signal terminal VREF6 to the eighth node N8. The nineteenth transistor M19 is turned on under the control of the low level of the input signal in, and the nineteenth transistor M19 provides the high level of the first reference signal terminal VREF1 to the second node N2. The twentieth transistor M20 is turned off under the control of the high level of the second node N2. The twenty-first transistor M21 is turned off under the control of the high level of the second node N2. The twenty-third transistor M23 is turned off under the control of the high level of the fourth clock signal ck4. The second cascade transistor T4 and the second output transistor T2 are turned off under the control of the high level of the second node N2. The first cascade transistor T3 and the first output transistor T1 are turned on under the control of the low level of the first node N1, the first cascade transistor T3 provides the high level of the third clock signal ck3 to the cascade signal terminal OT, and the first output transistor T1 provides the high level signal on the output control signal terminal CS to the driving output terminal OUT. The eighteenth transistor M18 is turned off under the control of the high level of the cascade signal. Then the cascade signal output by the cascade signal terminal OT is a high level, and the gate scanning signal output by the driving output terminal OUT is a high level.

In the second phase H2, the input signal in provides a high level, the first clock signal ck1 provides a high level, the third clock signal ck3 provides a low level, the fourth clock signal ck4 provides a high level, the first output control signal cs-1 on the first output control signal line CS-1 provides a high level, and the first output control signal cs-2 on the second output control signal line CS-2 provides a low level. The sixteenth transistor M16 is turned off under the control of the high level of the first clock signal ck1, and the seventh node N7 maintains a low level. The seventeenth transistor M17 is turned off under the control of the high level of the first clock signal ck1, and the third node N3 and the first node N1 maintain a low level. The twenty-second transistor M22 is turned on under the control of the low level of the third node N3, and the twenty-second transistor M22 provides the low level of the sixth reference signal terminal VREF6 to the eighth node N8. The nineteenth transistor M19 is turned off under the control of the high level of the input signal in, and the second node N2 maintains a high level. The twentieth transistor M20 is turned off under the control of the high level of the second node N2. The twenty-first transistor M21 is turned off under the control of the high level of the second node N2. The twenty-third transistor M23 is turned off under the control of the high level of the fourth clock signal ck4. The second cascade transistor T4 and the second output transistor T2 are turned off under the control of the high level of the second node N2. The first cascade transistor T3 and the first output transistor T1 are turned on under the control of the low level of the first node N1, the first cascade transistor T3 provides the low level of the third clock signal ck3 to the cascade signal terminal OT, and the first output transistor T1 provides the low level signal on the output control signal terminal CS to the driving output terminal OUT. The eighteenth transistor M18 is turned on under the control of the low level of the cascade signal, and the eighteenth transistor M18 provides the low level of the third clock signal ck3 to the seventh node N7. Then the cascade signal output by the cascade signal terminal OT is low level, and the gate scanning signal output by the driving output terminal OUT is low level.

In the third phase H3, the input signal in provides a high level, the first clock signal ck1 provides a high level, the third clock signal ck3 provides a high level, the fourth clock signal ck4 provides a low level, the first output control signal cs-1 on the first output control signal line CS-1 provides a low level, and the first output control signal cs-2 on the second output control signal line CS-2 provides a high level. The sixteenth transistor M16 is turned off under the control of the high level of the first clock signal ck1, and the seventh node N7 maintains a low level. The seventeenth transistor M17 is turned off under the control of the high level of the first clock signal ck1, and the third node N3 and the first node N1 maintain a low level. The twenty-second transistor M22 is turned on under the control of the low level of the third node N3, and the twenty-second transistor M22 provides the low level of the sixth reference signal terminal VREF6 to the eighth node N8. The nineteenth transistor M19 is turned off under the control of the high level of the input signal in, and the second node N2 maintains a high level. The twentieth transistor M20 is turned off under the control of the high level of the second node N2. The twenty-first transistor M21 is turned off under the control of the high level of the second node N2. The twenty-third transistor M23 is turned on under the control of the low level of the fourth clock signal ck4. The second cascade transistor T4 and the second output transistor T2 are turned on under the control of the low level of the second node N2, the second cascade transistor 4 provides the high level of the first reference signal VREF1 to the cascade signal terminal OT, and the second output transistor T2 provides the high level of the first reference signal VREF1 to the driving output terminal OUT. The first cascade transistor T3 and the first output transistor T1 are turned on under the control of the low level of the first node N1, the first cascade transistor T3 provides the high level of the third clock signal ck3 to the cascade signal terminal OT, and the first output transistor T1 provides the high level signal on the output control signal terminal CS to the driving output terminal OUT. The eighteenth transistor M18 is turned off under the control of the high level of the cascade signal. Then the cascade signal output by the cascade signal terminal OT is high level, and the gate scanning signal output by the driving output terminal OUT is high level.

In the subsequent time period, the shift register unit will repeat the working process of the above-mentioned stages H1 to H3.

Figure 10:
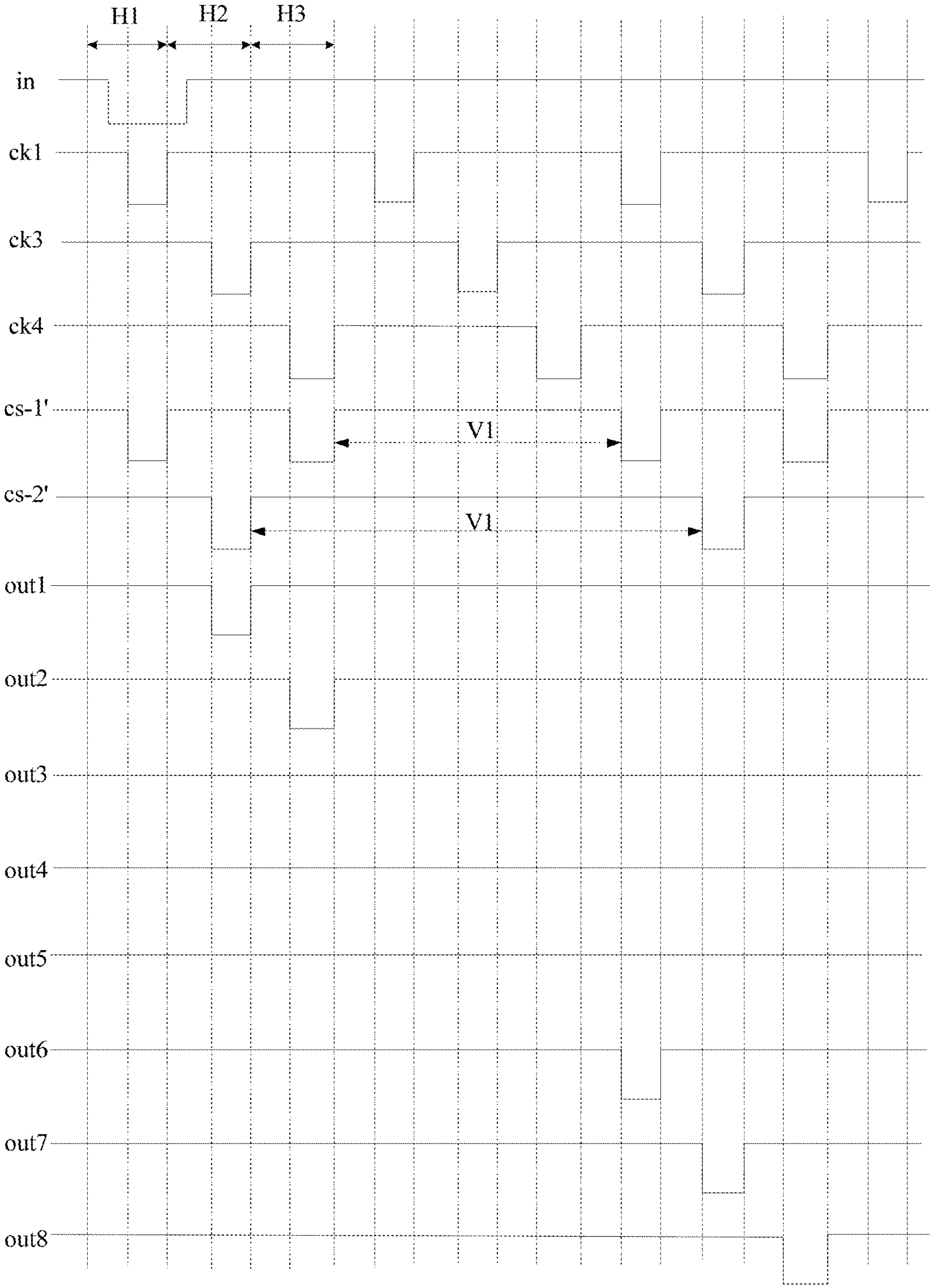
FIG. 10 is a timing diagram of some further signals provided by an embodiment of the present disclosure.

In some other embodiments of the present disclosure, as shown in FIG. 10, the second output control signals cs-1' and cs-2' include a clock signal portion and a fixed voltage signal portion of a first level V1. The clock signal portion in the second output control signals cs-1' and cs-2' is input to some shift register units, and the fixed voltage signal portion of the first level is input to the remaining shift register units. Exemplarily, the clock signal portion in the second output control signals cs-1' and cs-2' is input to the shift register units SR1, SR2, SR6, SR7, and SR8, and the fixed voltage signal portion of the first level V1 is input to the shift register units SR3, SR4, and SR5.

Exemplarily, in the local driving mode, the second output control signals cs-1' and cs-2' are respectively input to the output control signal terminals of the plurality of shift register units through the first output control signal line CS-1 and the second output control signal line CS-2. The signal timing diagram of the gate scanning signals out1 to out8 loaded by the scanning lines (e.g., GA1, GA2, GA3, GA4, GA5, GA6, GA7, GA8 in FIG. 4) is shown in FIG. 10.

As shown in FIG. 10, in represents the input signal of the input signal terminal IN, ck1 represents the first clock signal of the first clock signal terminal CK1, ck3 represents the third clock signal of the third clock signal terminal CK3, ck4 represents the fourth clock signal of the fourth clock signal terminal CK4, cs-1' represents the second output control signal on the first output control signal line CS-1, cs-2' represents the second output control signal on the second output control signal line CS-2, out1 represents the gate scanning signal of the driving output terminal OUT in the first shift register unit SR1, out2 represents the driving output terminal OUT in the second shift register unit SR2. out3 represents the gate scanning signal of the driving output terminal OUT in the third shift register unit SR3, out4 represents the gate scanning signal of the driving output terminal OUT in the fourth shift register unit SR4, out5 represents the gate scanning signal of the driving output terminal OUT in the fifth shift register unit SR5, out6 represents the gate scanning signal of the driving output terminal OUT in the sixth shift register unit SR6, out7 represents the gate scanning signal of the driving output terminal OUT in the seventh shift register unit SR7, and out8 represents the gate scanning signal of the driving output terminal OUT in the eighth shift register unit SR8.

The following takes the shift register unit structure shown in FIG. 8 as an example and describes the working process of the shift register unit provided by the embodiments of the present disclosure in combination with the signal timing diagram shown in FIG. 10.

As shown in FIG. 8, an example is given in which all transistors are P-type transistors, the valid pulse signal of the first reference signal outputted by the first reference signal terminal VREF1 is a high level signal, and the valid pulse signal of the sixth reference signal outputted by the sixth reference signal terminal VREF6 is a low level signal.

In the first phase H1, the input signal in provides a low level, the first clock signal ck1 provides a low level, the third clock signal ck3 provides a high level, the fourth clock signal ck4 provides a high level, the second output control signal cs-1' on the first output control signal line CS-1 provides a low level, and the second output control signal cs-2' on the second output control signal line CS-2 provides a high level. The sixteenth transistor M16 is turned on under the control of the low level of the first clock signal ck1, and the sixteenth transistor M16 provides the low level of the input signal in to the seventh node N7. The seventeenth transistor M17 is turned on under the control of the low level of the first clock signal ck1, and the sixteenth transistor M16 provides the low level of the seventh node N7 to the third node N3 and the first node N1. The twenty-second transistor M22 is turned on under the control of the low level of the third node N3, and the twenty-second transistor M22 provides the low level of the sixth reference signal terminal VREF6 to the eighth node N8. The nineteenth transistor M19 is turned on under the control of the low level of the input signal in, and the nineteenth transistor M19 provides the high level of the first reference signal terminal VREF1 to the second node N2. The twentieth transistor M20 is turned off under the control of the high level of the second node N2. The twenty-first transistor M21 is turned off under the control of the high level of the second node N2. The twenty-third transistor M23 is turned off under the control of the high level of the fourth clock signal ck4. The second cascade transistor T4 and the second output transistor T2 are turned off under the control of the high level of the second node N2. The first cascade transistor T3 and the first output transistor T1 are turned on under the control of the low level of the first node N1, the first cascade transistor T3 provides the high level of the third clock signal ck3 to the cascade signal terminal OT, and the first output transistor T1 provides the high level signal on the output control signal terminal CS to the driving output terminal OUT. The eighteenth transistor M18 is turned off under the control of the high level of the cascade signal. Then the cascade signal output by the cascade signal terminal OT is a high level, and the gate scanning signal output by the driving output terminal OUT is a high level.

In the second phase H2, the input signal in provides a high level, the first clock signal ck1 provides a high level, the third clock signal ck3 provides a low level, the fourth clock signal ck4 provides a high level, the second output control signal cs-1' on the first output control signal line CS-1 provides a high level, and the second output control signal cs-2' on the second output control signal line CS-2 provides a low level. The sixteenth transistor M16 is turned off under the control of the high level of the first clock signal ck1, and the seventh node N7 maintains a low level. The seventeenth transistor M17 is turned off under the control of the high level of the first clock signal ck1, and the third node N3 and the first node N1 maintain a low level. The twenty-second transistor M22 is turned on under the control of the low level of the third node N3, and the twenty-second transistor M22 provides the low level of the sixth reference signal terminal VREF6 to the eighth node N8. The nineteenth transistor M19 is turned off under the control of the high level of the input signal in, and the second node N2 maintains a high level. The twentieth transistor M20 is turned off under the control of the high level of the second node N2. The twenty-first transistor M21 is turned off under the control of the high level of the second node N2. The twenty-third transistor M23 is turned off under the control of the high level of the fourth clock signal ck4. The second cascade transistor T4 and the second output transistor T2 are turned off under the control of the high level of the second node N2. The first cascade transistor T3 and the first output transistor T1 are turned on under the control of the low level of the first node N1, the first cascade transistor T3 provides the low level of the third clock signal ck3 to the cascade signal terminal OT, and the first output transistor T1 provides the low level signal on the output control signal terminal CS to the driving output terminal OUT. The eighteenth transistor M18 is turned on under the control of the low level of the cascade signal, and the eighteenth transistor M18 provides the low level of the third clock signal ck3 to the seventh node N7. Then the cascade signal output by the cascade signal terminal OT is low level, and the gate scanning signal output by the driving output terminal OUT is low level.

In the third phase H3, the input signal in provides a high level, the first clock signal ck1 provides a high level, the third clock signal ck3 provides a high level, the fourth clock signal ck4 provides a low level, the second output control signal cs-1' on the first output control signal line CS-1 provides a low level, and the second output control signal cs-2' on the second output control signal line CS-2 provides a high level. The sixteenth transistor M16 is turned off under the control of the high level of the first clock signal ck1, and the seventh node N7 maintains a low level. The seventeenth transistor M17 is turned off under the control of the high level of the first clock signal ck1, and the third node N3 and the first node N1 maintain a low level. The twenty-second transistor M22 is turned on under the control of the low level of the third node N3, and the twenty-second transistor M22 provides the low level of the sixth reference signal terminal VREF6 to the eighth node N8. The nineteenth transistor M19 is turned off under the control of the high level of the input signal in, and the second node N2 maintains a high level. The twentieth transistor M20 is turned off under the control of the high level of the second node N2. The twenty-first transistor M21 is turned off under the control of the high level of the second node N2. The twenty-third transistor M23 is turned on under the control of the low level of the fourth clock signal ck4. The second cascade transistor T4 and the second output transistor T2 are turned on under the control of the low level of the second node N2, the second cascade transistor 4 provides the high level of the first reference signal VREF1 to the cascade signal terminal OT, and the second output transistor T2 provides the high level of the first reference signal VREF1 to the driving output terminal OUT. The first cascade transistor T3 and the first output transistor T1 are turned on under the control of the low level of the first node N1, the first cascade transistor T3 provides the high level of the third clock signal ck3 to the cascade signal terminal OT, and the first output transistor T1 provides the high level signal on the output control signal terminal CS to the driving output terminal OUT. The eighteenth transistor M18 is turned off under the control of the high level of the cascade signal. Then the cascade signal output by the cascade signal terminal OT is high level, and the gate scanning signal output by the driving output terminal OUT is high level.

In the subsequent time period, the shift register unit will repeat the working process of the above-mentioned stages H1 to H3.

In the embodiments of the present disclosure, the signal at the output control signal terminal is controlled to control the gate scanning signal at the driving output terminal in the output circuit, thereby controlling any area of the display panel to be scanned, and controlling any area of the display panel not to be scanned, thereby saving power consumption and reducing losses.

Figure 11:
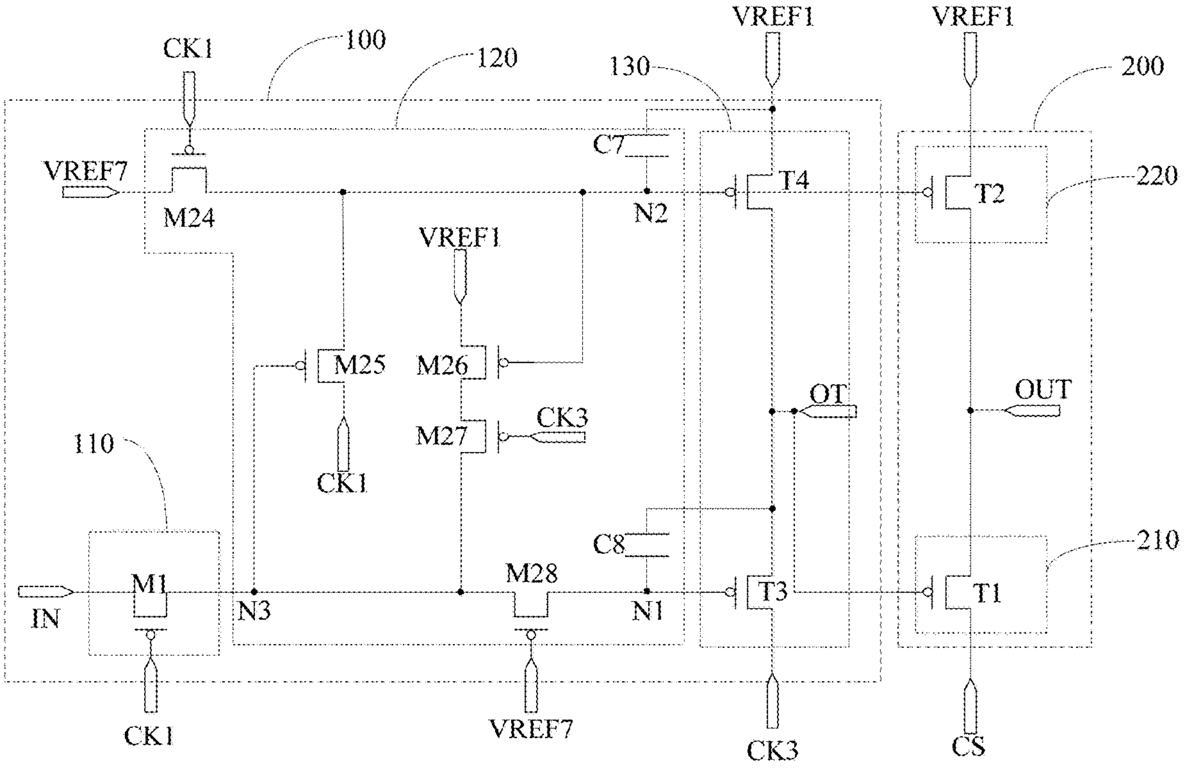
FIG. 11 is a schematic diagram of some further structures of a shift register unit provided by an embodiment of the present disclosure.

Some embodiments of the present disclosure further provide another structural diagram of a shift register unit, as shown in FIG. 11, which is a modification of the implementation in the above embodiments. The following only describes the differences between this embodiment and the above embodiments, and the similarities are not repeated here.

In some other embodiments of the present disclosure, as shown in FIG. 11, the first output circuit 210 is coupled to the cascade output terminal OT in the shift register 100 and is configured to transmit a signal from the output control signal terminal CS to the driving output terminal OUT in response to a signal of the cascade output terminal OT.

In some other embodiments of the present disclosure, as shown in FIG. 11, the gate of the first output transistor T1 is coupled to the cascade output terminal OT, the first electrode of the first output transistor T1 is coupled to the output control signal terminal CS, and the second electrode of the first output transistor T1 is coupled to the driving output terminal OUT.

In some other embodiments of the present disclosure, as shown in FIG. 11, the control subcircuit includes: a twenty-fourth transistor M24, a twenty-fifth transistor M25, a twenty-sixth transistor M26, a twenty-seventh transistor M27, a twenty-eighth transistor M28, a seventh capacitor C7, and an eighth capacitor C8. The gate of the twenty-fourth transistor M24 is coupled to the first clock signal terminal CK1, the first electrode of the twenty-fourth transistor M24 is coupled to the seventh reference signal terminal VREF7, and the second electrode of the twenty-fourth transistor M24 is coupled to the second node N2. The gate of the twenty-fifth transistor M25 is coupled to the third node N3, the first electrode of the twenty-fifth transistor M25 is coupled to the second node N2, and the second electrode of the twenty-fifth transistor M25 is coupled to the first clock signal terminal CK1. The gate of the twenty-sixth transistor M26 is coupled to the second node N2. The first electrode of the transistor M26 is coupled to the first reference signal terminal VREF1, the second electrode of the twenty-sixth transistor M26 is coupled to the first electrode of the twenty-seventh transistor M27. The gate of the twenty-seventh transistor M27 is coupled to the third clock signal terminal CK3, the second electrode of the twenty-seventh transistor M27 is coupled to the first electrode of the twenty-eighth transistor M28. The gate of the twenty-eighth transistor M28 is coupled to the seventh reference signal terminal VREF7, the first electrode of the twenty-eighth transistor M28 is coupled to the third node N3, the second electrode of the twenty-eighth transistor M28 is coupled to the first node N1. The first electrode of the seventh capacitor C7 is coupled to the first reference signal terminal VREF1, the second electrode of the seventh capacitor C7 is coupled to the first node N1. The first electrode of the eighth capacitor C8 is coupled to the cascade output terminal OT, the second electrode of the eighth capacitor C8 is coupled to the first node N1.

Figure 12:
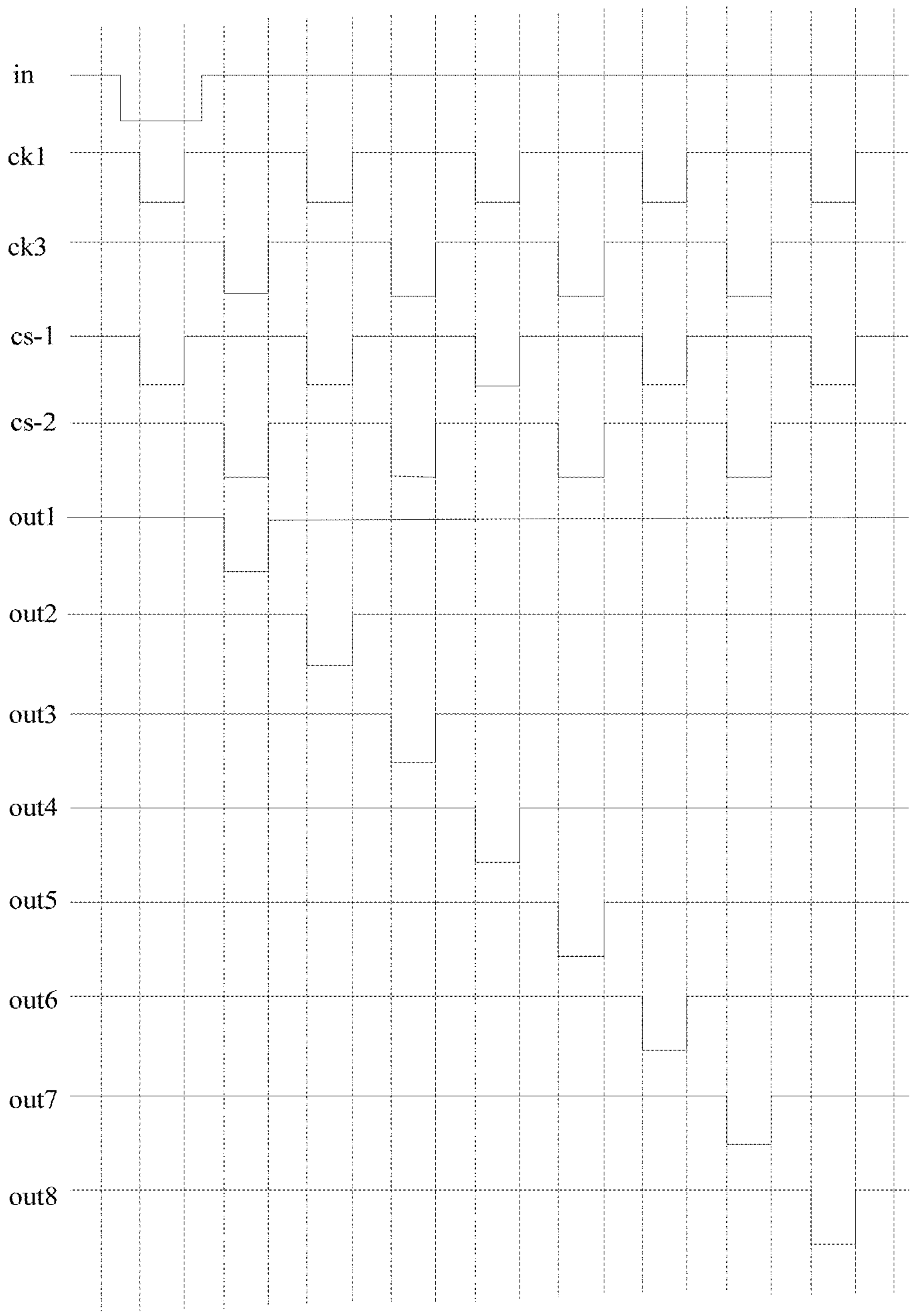
FIG. 12 is a timing diagram of some further signals provided by an embodiment of the present disclosure.

In some other embodiments of the present disclosure, as shown in FIG. 12, the first output control signals cs-1 and cs-2 are clock signals.

Exemplarily, in the full-screen driving mode, the first output control signals cs-1 and cs-2 are respectively input to the output control signal terminals of the plurality of shift register units through the first output control signal line CS-1 and the second output control signal line CS-2. The signal timing diagram of the gate scanning signals out1 to out8 loaded by the scanning lines (e.g., GA1, GA2, GA3, GA4, GA5, GA6, GA7, GA8 in FIG. 4) is shown in FIG. 12.

As shown in FIG. 12, in represents the input signal of the input signal terminal IN, ck1 represents the first clock signal of the first clock signal terminal CK1, ck3 represents the third clock signal of the third clock signal terminal CK3, cs-1 represents the first output control signal on the first output control signal line CS-1, and cs-2 represents the first output control signal on the second output control signal line CS-2, out1 represents the gate scanning signal of the driving output terminal OUT in the first shift register unit SR1, out2 represents the gate scanning signal of the driving output terminal OUT in the second shift register unit SR2, out3 represents the gate scanning signal of the driving output terminal OUT in the third shift register unit SR3, out4 represents the gate scanning signal of the driving output terminal OUT in the fourth shift register unit SR4, out5 represents the gate scanning signal of the driving output terminal OUT in the fifth shift register unit SR5, out6 represents the gate scanning signal of the driving output terminal OUT in the sixth shift register unit SR6, out7 represents the gate scanning signal of the driving output terminal OUT in the seventh shift register unit SR7, and out8 represents the gate scanning signal of the driving output terminal OUT in the eighth shift register unit SR8.

The following takes the shift register unit structure shown in FIG. 11 as an example and describes the working process of the shift register unit provided by the embodiments of the present disclosure in combination with the signal timing diagram shown in FIG. 12.

As shown in FIG. 11, an example is given in which all transistors are P-type transistors, the valid pulse signal of the first reference signal outputted by the first reference signal terminal VREF1 is a high level signal, and the valid pulse signal of the seventh reference signal outputted by the seventh reference signal terminal VREF7 is a low level signal.

Since the twenty-eighth transistor M28 is coupled to the seventh reference signal terminal VREF7, and the seventh reference signal terminal VREF7 inputs a low-level signal, the twenty-eighth transistor M28 is normally turned on. For ease of description, the state of the twenty-eighth transistor M28 at any time will not be analyzed below.

In the first phase H1, the input signal in provides a low level, the first clock signal ck1 provides a low level, the third clock signal ck3 provides a high level, the first output control signal cs-1 on the first output control signal line CS-1 provides a low level, and the first output control signal cs-2 on the second output control signal line CS-2 provides a high level. The first transistor M1 is turned on under the control of the low level of the first clock signal ck1, and the first transistor M1 provides the low level of the input signal in to the third node N3. The twenty-eighth transistor M28 provides the low level of the third node N3 to the first node N1. The first cascade transistor T3 and the first output transistor T1 are turned on under the control of the low level of the first node N1, the first cascade transistor T3 provides the high level of the third clock signal ck3 to the cascade signal terminal OT, and the first output transistor T1 provides the high level signal on the output control signal terminal CS to the driving output terminal OUT. The twenty-fifth transistor M25 is turned on under the control of the low level of the third node N3, and the twenty-fifth transistor M25 provides the low level of the first clock signal ck1 to the second node N2. The twenty-fourth transistor M24 is turned on under the control of the low level of the first clock signal ck1, and the twenty-fourth transistor M24 provides the low level of the seventh reference signal terminal VREF7 to the second node N2. The twenty-sixth transistor M26 is turned on under the control of the low level of the second node N2, and the twenty-sixth transistor M26 provides the high level of the first reference signal terminal VREF1 to the first electrode of the twenty-seventh transistor M27, and the twenty-seventh transistor M27 is turned off under the control of the high level of the third clock signal ck3. The second cascade transistor T4 and the second output transistor T2 are turned on under the control of the low level of the second node N2, and the second cascade transistor T4 provides the high level of the first reference signal terminal VREF1 to the cascade signal terminal OT, and the second output transistor T2 provides the high level of the first reference signal terminal VREF1 to the driving output terminal OUT. Then the cascade signal output by the cascade signal terminal OT is a high level, and the gate scanning signal output by the driving output terminal OUT is a high level.

In the second stage H2, the input signal in provides a high level, the first clock signal ck1 provides a high level, the third clock signal ck3 provides a low level, the first output control signal cs-1 on the first output control signal line CS-1 provides a high level, and the first output control signal cs-2 on the second output control signal line CS-2 provides a low level. The first transistor M1 is turned off under the control of the high level of the first clock signal ck1, and the third node N3 maintains a low level. The twenty-eighth transistor M28 provides the low level of the third node N3 to the first node N1. The first cascade transistor T3 and the first output transistor T1 are turned on under the control of the low level of the first node N1. The first cascade transistor T3 provides the low level of the third clock signal ck3 to the cascade signal terminal OT, and the first output transistor T1 provides the low level signal on the output control signal terminal CS to the driving output terminal OUT. The twenty-fourth transistor M24 is turned off under the control of the high level of the first clock signal ck1, and the second node N2 maintains a low level. The twenty-fifth transistor M25 is turned on under the control of the low level of the third node N3, and the twenty-fifth transistor M25 provides the high level of the first clock signal ck1 to the second node N2, and the second node N2 is at a high level. The twenty-sixth transistor M26 is turned off under the control of the high level of the second node N2, and the twenty-seventh transistor M27 is turned on under the control of the low level of the third clock signal ck3. The second cascade transistor T4 and the second output transistor T2 are turned off under the control of the high level of the second node N2. Then the cascade signal output by the cascade signal terminal OT is at a low level, and the gate scanning signal output by the driving output terminal OUT is at a low level.

In the third phase H3, the input signal in provides a high level, the first clock signal ck1 provides a low level, the third clock signal ck3 provides a high level, the first output control signal cs-1 on the first output control signal line CS-1 provides a low level, and the first output control signal cs-2 on the second output control signal line CS-2 provides a high level. The first transistor M1 is turned on under the control of the low level of the first clock signal ck1, and the first transistor M1 provides the high level of the input signal in to the third node N3. The twenty-eighth transistor M28 provides the high level of the third node N3 to the first node N1. The first cascade transistor T3 and the first output transistor T1 are turned off under the control of the high level of the first node N1. The twenty-fifth transistor M25 is turned off under the control of the high level of the third node N3. The twenty-fourth transistor M24 is turned on under the control of the low level of the first clock signal ck1, and the twenty-fourth transistor M24 provides the low level of the seventh reference signal terminal VREF7 to the second node N2. The twenty-sixth transistor M26 is turned on under the low level control of the second node N2, and the twenty-sixth transistor M26 provides the high level of the first reference signal terminal VREF1 to the first electrode of the twenty-seventh transistor M27, and the twenty-seventh transistor M27 is turned off under the high level control of the third clock signal ck3. The second cascade transistor T4 and the second output transistor T2 are turned on under the low level control of the second node N2, and the second cascade transistor T4 provides the high level of the first reference signal terminal VREF1 to the cascade signal terminal OT, and the second output transistor T2 provides the high level of the first reference signal terminal VREF1 to the driving output terminal OUT. Then the cascade signal output by the cascade signal terminal OT is a high level, and the gate scanning signal output by the driving output terminal OUT is a high level.

In the subsequent time period, the shift register unit will repeat the working process of the above-mentioned stages H1 to H3.

Figure 13:
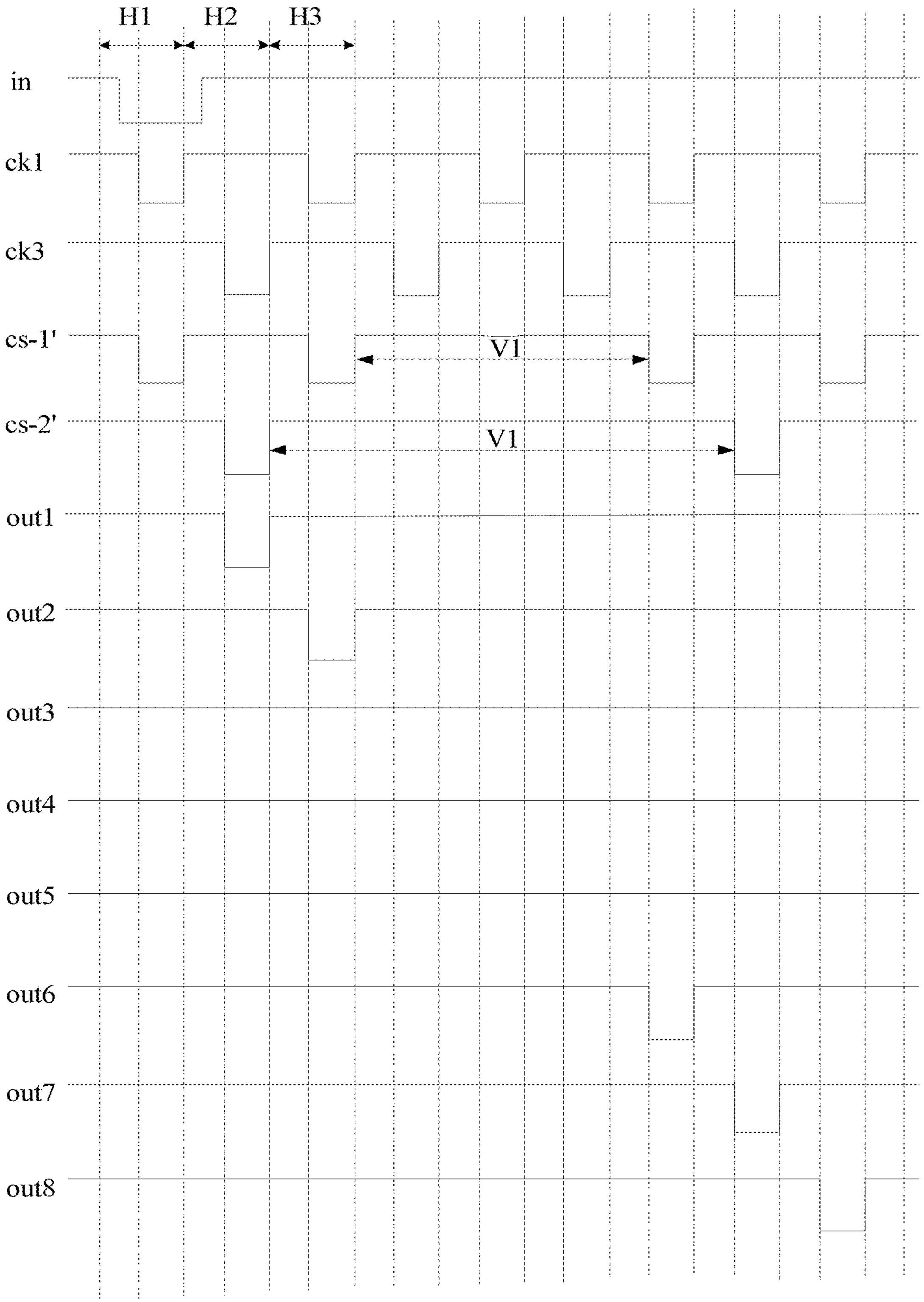
FIG. 13 is a timing diagram of some further signals provided by an embodiment of the present disclosure.

In some other embodiments of the present disclosure, as shown in FIG. 13, the second output control signals cs-1' and cs-2' include a clock signal portion and a fixed voltage signal portion with a first level V1. The clock signal portion in the second output control signals cs-1' and cs-2' is input to some shift register units, and the fixed voltage signal portion with the first level is input to the remaining shift register units. Exemplarily, the clock signal portion in the second output control signals cs-1' and cs-2' is input to the shift register units SR1, SR2, SR6, SR7, and SR8, and the fixed voltage signal portion with the first level V1 is input to the shift register units SR3, SR4, and SR5.

In the subsequent time period, the shift register unit will repeat the working process of the above-mentioned stages H1 to H3.

Exemplarily, in the local driving mode, the second output control signals cs-1' and cs-2' are respectively input to the output control signal terminals of the plurality of shift register units through the first output control signal line CS-1 and the second output control signal line CS-2. The signal timing diagram of the gate scanning signals out1 to out8 loaded by the scanning lines (e.g., GA1, GA2, GA3, GA4, GA5, GA6, GA7, GA8 in FIG. 4) is shown in FIG. 13.

As shown in FIG. 13, in represents the input signal of the input signal terminal IN, ck1 represents the first clock signal of the first clock signal terminal CK1, ck3 represents the third clock signal of the third clock signal terminal CK3, cs-1' represents the second output control signal on the first output control signal line CS-1, cs-2' represents the second output control signal on the second output control signal line CS-2, out1 represents the gate scanning signal of the driving output terminal OUT in the first shift register unit SR1, out2 represents the gate scanning signal of the driving output terminal OUT in the second shift register unit SR2, and out3 represents the gate scanning signal of the driving output terminal OUT in the third shift register unit SR3, out4 represents the gate scanning signal of the driving output terminal OUT in the fourth shift register unit SR4, out5 represents the gate scanning signal of the driving output terminal OUT in the fifth shift register unit SR5, out6 represents the gate scanning signal of the driving output terminal OUT in the sixth shift register unit SR6, out7 represents the gate scanning signal of the driving output terminal OUT in the seventh shift register unit SR7, and out8 represents the gate scanning signal of the driving output terminal OUT in the eighth shift register unit SR8.

The following takes the shift register unit structure shown in FIG. 11 as an example and describes the working process of the shift register unit provided by the embodiment of the present disclosure in combination with the signal timing diagram shown in FIG. 13.

As shown in FIG. 11, an example is given in which all transistors are P-type transistors, the valid pulse signal of the first reference signal outputted by the first reference signal terminal VREF1 is a high level signal, and the valid pulse signal of the seventh reference signal outputted by the seventh reference signal terminal VREF7 is a low level signal.

Since the twenty-eighth transistor M28 is coupled to the seventh reference signal terminal VREF7, and the seventh reference signal terminal VREF7 inputs a low-level signal, the twenty-eighth transistor M28 is normally turned on. For ease of description, the state of the twenty-eighth transistor M28 at any time will not be analyzed below.

In the first phase H1, the input signal in provides a low level, the first clock signal ck1 provides a low level, the third clock signal ck3 provides a high level, the first output control signal cs-1 on the first output control signal line CS-1 provides a low level, and the first output control signal cs-2 on the second output control signal line CS-2 provides a high level. The first transistor M1 is turned on under the control of the low level of the first clock signal ck1, and the first transistor M1 provides the low level of the input signal in to the third node N3. The twenty-eighth transistor M28 provides the low level of the third node N3 to the first node N1. The first cascade transistor T3 and the first output transistor T1 are turned on under the control of the low level of the first node N1, the first cascade transistor T3 provides the high level of the third clock signal ck3 to the cascade signal terminal OT, and the first output transistor T1 provides the high level signal on the output control signal terminal CS to the driving output terminal OUT. The twenty-fifth transistor M25 is turned on under the control of the low level of the third node N3, and the twenty-fifth transistor M25 provides the low level of the first clock signal ck1 to the second node N2. The twenty-fourth transistor M24 is turned on under the control of the low level of the first clock signal ck1, and the twenty-fourth transistor M24 provides the low level of the seventh reference signal terminal VREF7 to the second node N2. The twenty-sixth transistor M26 is turned on under the control of the low level of the second node N2, and the twenty-sixth transistor M26 provides the high level of the first reference signal terminal VREF1 to the first electrode of the twenty-seventh transistor M27, and the twenty-seventh transistor M27 is turned off under the control of the high level of the third clock signal ck3. The second cascade transistor T4 and the second output transistor T2 are turned on under the control of the low level of the second node N2, and the second cascade transistor T4 provides the high level of the first reference signal terminal VREF1 to the cascade signal terminal OT, and the second output transistor T2 provides the high level of the first reference signal terminal VREF1 to the driving output terminal OUT. Then the cascade signal output by the cascade signal terminal OT is a high level, and the gate scanning signal output by the driving output terminal OUT is a high level.

In the second stage H2, the input signal in provides a high level, the first clock signal ck1 provides a high level, the third clock signal ck3 provides a low level, the first output control signal cs-1 on the first output control signal line CS-1 provides a high level, and the first output control signal cs-2 on the second output control signal line CS-2 provides a low level. The first transistor M1 is turned off under the control of the high level of the first clock signal ck1, and the third node N3 maintains a low level. The twenty-eighth transistor M28 provides the low level of the third node N3 to the first node N1. The first cascade transistor T3 and the first output transistor T1 are turned on under the control of the low level of the first node N1. The first cascade transistor T3 provides the low level of the third clock signal ck3 to the cascade signal terminal OT, and the first output transistor T1 provides the low level signal on the output control signal terminal CS to the driving output terminal OUT. The twenty-fourth transistor M24 is turned off under the control of the high level of the first clock signal ck1, and the second node N2 maintains a low level. The twenty-fifth transistor M25 is turned on under the control of the low level of the third node N3, and the twenty-fifth transistor M25 provides the high level of the first clock signal ck1 to the second node N2, and the second node N2 is at a high level. The twenty-sixth transistor M26 is turned off under the control of the high level of the second node N2, and the twenty-seventh transistor M27 is turned on under the control of the low level of the third clock signal ck3. The second cascade transistor T4 and the second output transistor T2 are turned off under the control of the high level of the second node N2. Then the cascade signal output by the cascade signal terminal OT is at a low level, and the gate scanning signal output by the driving output terminal OUT is at a low level.

In the third phase H3, the input signal in provides a high level, the first clock signal ck1 provides a low level, the third clock signal ck3 provides a high level, the first output control signal cs-1 on the first output control signal line CS-1 provides a low level, and the first output control signal cs-2 on the second output control signal line CS-2 provides a high level. The first transistor M1 is turned on under the control of the low level of the first clock signal ck1, and the first transistor M1 provides the high level of the input signal in to the third node N3. The twenty-eighth transistor M28 provides the high level of the third node N3 to the first node N1. The first cascade transistor T3 and the first output transistor T1 are turned off under the control of the high level of the first node N1. The twenty-fifth transistor M25 is turned off under the control of the high level of the third node N3. The twenty-fourth transistor M24 is turned on under the control of the low level of the first clock signal ck1, and the twenty-fourth transistor M24 provides the low level of the seventh reference signal terminal VREF7 to the second node N2. The 26th transistor M26 is turned on under the low level control of the second node N2, and the twenty-sixth transistor M26 provides the high level of the first reference signal terminal VREF1 to the first electrode of the twenty-seventh transistor M27, and the twenty-seventh transistor M27 is turned off under the high level control of the third clock signal ck3. The second cascade transistor T4 and the second output transistor T2 are turned on under the low level control of the second node N2, and the second cascade transistor T4 provides the high level of the first reference signal terminal VREF1 to the cascade signal terminal OT, and the second output transistor T2 provides the high level of the first reference signal terminal VREF1 to the driving output terminal OUT. Then the cascade signal output by the cascade signal terminal OT is a high level, and the gate scanning signal output by the driving output terminal OUT is a high level.

In the subsequent time period, the shift register unit will repeat the working process of the above-mentioned stages H1 to H3.

In the embodiments of the present disclosure, the signal at the output control signal terminal is controlled to control the gate scanning signal at the driving output terminal in the output circuit, thereby controlling any area of the display panel to be scanned, and controlling any area of the display panel not to be scanned, thereby saving power consumption and reducing losses.

Although the preferred embodiments of the present disclosure have been described, those skilled in the art may make additional changes and modifications to these embodiments once they have learned the basic creative concept. Therefore, the appended claims are intended to be interpreted as including the preferred embodiments and all changes and modifications falling within the scope of the present disclosure.

Obviously, those skilled in the art can make various changes and modifications to the embodiments of the present disclosure without departing from the spirit and scope of the embodiments of the present disclosure. Thus, if these modifications and variations of the embodiments of the present disclosure fall within the scope of the claims of the present disclosure and their equivalents, the present disclosure is also intended to include these modifications and variations.

What is claimed is:

1. A display panel, comprising:

a plurality of shift register units and a plurality of output control signal lines coupled to the shift register units; the plurality of output control signal lines being arranged between the shift register units coupled thereto and a display area of the display panel;

wherein the shift register unit comprises:

a shift register configured to output a cascade signal through a cascade output terminal;

an output circuit coupled to the shift register, and the output circuit being configured to control a driving output terminal to output a gate scanning signal according to a signal of an output control signal terminal and a signal of a first reference signal terminal;

wherein the plurality of output control signal lines comprises: a first output control signal line and a second output control signal line; the first output control signal line is coupled to output control signal terminals of odd-numbered shift register units, and the second output control signal line is coupled to output control signal terminals of even-numbered shift register units.

2. The display panel according to claim 1, wherein the output circuit comprises: a first output circuit and a second output circuit;

the first output circuit is coupled to the cascade output terminal or a first node in the shift register and is configured to transmit the signal of the output control signal terminal to the driving output terminal in response to a signal of the cascade output terminal or a signal of the first node;

the second output circuit is coupled to a second node in the shift register, and is configured to transmit the signal of the first reference signal terminal to the driving output terminal in response to a signal of the second node.

3. The display panel according to claim 2, wherein the first output circuit comprises: a first output transistor;

a gate of the first output transistor is coupled to the cascade output terminal or the first node, a first electrode of the first output transistor is coupled to the output control signal terminal, and a second electrode of the first output transistor is coupled to the driving output terminal; or wherein the second output circuit comprises: a second output transistor;

a gate of the second output transistor is coupled to the second node, a first electrode of the second output transistor is coupled to the first reference signal terminal, and a second electrode of the second output transistor is coupled to the driving output terminal.

4. The display panel according to claim 1, wherein the shift register comprises:

an input subcircuit configured to provide a signal of an input signal terminal to a third node in response to a signal of a first clock signal terminal;

a control subcircuit configured to control signals of the first node and the second node, and provide a signal of the third node to the first node or the second node;

a cascade subcircuit configured to enable the cascade output terminal to output the cascade signal in response to the signals of the first node and the second node.

5. The display panel according to claim 4, wherein the input subcircuit comprises: a first transistor;

a gate of the first transistor is coupled to the first clock signal terminal, a first electrode of the first transistor is coupled to the input signal terminal, and a second electrode of the first transistor is coupled to the third node;

or wherein the control subcircuit comprises: a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a first capacitor, a second capacitor, a third capacitor and a fourth capacitor;

a gate of the second transistor is coupled to the third node, a first electrode of the second transistor is coupled to the first clock signal terminal, and a second electrode of the second transistor is coupled to a fourth node;

a gate of the third transistor is coupled to a second reference signal terminal, a first electrode of the third transistor is coupled to the fourth node, and a second electrode of the third transistor is coupled to a gate of the fourth transistor;

a first electrode of the fourth transistor is coupled to a second clock signal terminal, and a second electrode of the fourth transistor is coupled to a first electrode of the fifth transistor;

a gate of the fifth transistor is coupled to the second clock signal terminal, and a second electrode of the fifth transistor is coupled to the first node;

a gate of the sixth transistor is coupled to the first clock signal terminal, a first electrode of the sixth transistor is coupled to the input signal terminal, and a second electrode of the sixth transistor is coupled to a first electrode of the seventh transistor;

a gate of the seventh transistor is coupled to the second reference signal terminal, and a second electrode of the seventh transistor is coupled to a fifth node;

a gate of the eighth transistor is coupled to the fifth node, a first electrode of the eighth transistor is coupled to the fifth node, and a second electrode of the eighth transistor is coupled to the second node;

a gate of the ninth transistor is coupled to the first clock signal terminal, a first electrode of the ninth transistor is coupled to the second reference signal terminal, and a second electrode of the ninth transistor is coupled to a gate of the tenth transistor;

a first electrode of the tenth transistor is coupled to a third reference signal terminal, and a second electrode of the tenth transistor is coupled to a sixth node;

a gate of the eleventh transistor is coupled to the fifth node, a first electrode of the eleventh transistor is coupled to the sixth node, and a second electrode of the eleventh transistor is coupled to the second clock signal terminal;

a gate of the twelfth transistor is coupled to a first electrode of the fifteenth transistor, a first electrode of the twelfth transistor is coupled to the first node, and a second electrode of the twelfth transistor is coupled to a fourth reference signal terminal;

a gate of the thirteenth transistor is coupled to a fifth reference signal terminal, a first electrode of the thirteenth transistor is coupled to the fourth reference signal terminal, and a second electrode of the thirteenth transistor is coupled to a first electrode of the fourteenth transistor;

a gate of the fourteenth transistor is coupled to the first reference signal terminal, and a second electrode of the fourteenth transistor is coupled to the first electrode of the fifteenth transistor;

a gate of the fifteenth transistor is coupled to the first reference signal terminal, the first electrode of the fifteenth transistor is coupled to the third node, and a second electrode of the fifteenth transistor is coupled to the second node;

a first electrode of the first capacitor is coupled to the gate of the fourth transistor, and a second electrode of the first capacitor is coupled to the second electrode of the fourth transistor;

a first electrode of the second capacitor is coupled to the sixth node, and a second electrode of the second capacitor is coupled to the second electrode of the seventh transistor;

a first electrode of the third capacitor is coupled to the fourth reference signal terminal, and a second electrode of the third capacitor is coupled to the first node;

a first electrode of the fourth capacitor is coupled to the cascade output terminal, and a second electrode of the fourth capacitor is coupled to the first reference signal terminal;

or wherein the cascade subcircuit comprises: a first cascade transistor and a second cascade transistor;

a gate of the first cascade transistor is coupled to the first node, a first electrode of the first cascade transistor is coupled to a fourth reference signal terminal, and a second electrode of the first cascade transistor is coupled to the cascade output terminal;

a gate of the second cascade transistor is coupled to the second node, a first electrode of the second cascade transistor is coupled to the cascade output terminal, and a second electrode of the second cascade transistor is coupled to the first reference signal terminal;

or wherein the input subcircuit comprises: a sixteenth transistor and a seventeenth transistor;

a gate of the sixteenth transistor is coupled to the first clock signal terminal, a first electrode of the sixteenth transistor is coupled to the input signal terminal, and a second electrode of the sixteenth transistor is coupled to a seventh node;

a gate of the seventeenth transistor is coupled to the first clock signal terminal, a first electrode of the seventeenth transistor is coupled to the seventh node, and a second electrode of the seventeenth transistor is coupled to the third node;

or wherein the control subcircuit comprises: an eighteenth transistor, a nineteenth transistor, a twentieth transistor, a twenty-first transistor, a twenty-second transistor, a twenty-third transistor, a fifth capacitor, and a sixth capacitor;

a gate of the eighteenth transistor is coupled to the cascade output terminal, a first electrode of the eighteenth transistor is coupled to a third clock signal terminal, and a second electrode of the eighteenth transistor is coupled to a seventh node;

a gate of the nineteenth transistor is coupled to the input signal terminal, a first electrode of the nineteenth transistor is coupled to the first reference signal terminal, and a second electrode of the nineteenth transistor is coupled to the second node;

a gate of the twentieth transistor is coupled to the second node, a first electrode of the twentieth transistor is coupled to the first reference signal terminal, and a second electrode of the twentieth transistor is coupled to an eighth node;

a gate of the twenty-first transistor is coupled to the second node, a first electrode of the twenty-first transistor is coupled to the eighth node, and a second electrode of the twenty-first transistor is coupled to the third node;

a gate of the twenty-second transistor is coupled to the third node, a first electrode of the twenty-second transistor is coupled to the eighth node, and a second electrode of the twenty-second transistor is coupled to a sixth reference signal terminal;

a gate of the twenty-third transistor is coupled to a fourth clock signal terminal, a first electrode of the twenty-third transistor is coupled to the second node, and a second electrode of the twenty-third transistor is coupled to the sixth reference signal terminal;

a first electrode of the fifth capacitor is coupled to the first reference signal terminal, and a second electrode of the fifth capacitor is coupled to the first electrode of the twenty-third transistor;

a first electrode of the sixth capacitor is coupled to the cascade output terminal, and a second electrode of the sixth capacitor is coupled to the first node;

or wherein the cascade subcircuit comprises: a first cascade transistor and a second cascade transistor;

a gate of the first cascade transistor is coupled to the first node, a first electrode of the first cascade transistor is coupled to the cascade output terminal, and a second electrode of the first cascade transistor is coupled to a third clock signal terminal;

a gate of the second cascade transistor is coupled to the second node, a first electrode of the second cascade transistor is coupled to the first reference signal terminal, and a second electrode of the second cascade transistor is coupled to the cascade output terminal;

or wherein the control subcircuit comprises: a twenty-fourth transistor, a twenty-fifth transistor, a twenty-sixth transistor, a twenty-seventh transistor, a twenty-eighth transistor, a seventh capacitor, and an eighth capacitor;

a gate of the twenty-fourth transistor is coupled to the first clock signal terminal, a first electrode of the twenty-fourth transistor is coupled to a seventh reference signal terminal, and a second electrode of the a transistor is coupled to the second node;

a gate of the twenty-fifth transistor is coupled to the third node, a first electrode of the twenty-fifth transistor is coupled to the second node, and a second electrode of the twenty-fifth transistor is coupled to the first clock signal terminal;

a gate of the twenty-sixth transistor is coupled to the second node, a first electrode of the twenty-sixth transistor is coupled to the first reference signal terminal, and a second electrode of the twenty-sixth transistor is coupled to a first electrode of the twenty-seventh transistor;

a gate of the twenty-seventh transistor is coupled to a third clock signal terminal, and a second electrode of the twenty-seventh transistor is coupled to a first electrode of the twenty-eighth transistor;

a gate of the twenty-eighth transistor is coupled to the seventh reference signal terminal, a first electrode of the twenty-eighth transistor is coupled to the third node, and a second electrode of the twenty-eighth transistor is coupled to the first node;

a first electrode of the seventh capacitor is coupled to the first reference signal terminal, and a second electrode of the seventh capacitor is coupled to the first node;

a first electrode of the eighth capacitor is coupled to the cascade output terminal, and a second electrode of the eighth capacitor is coupled to the first node.

6. A display panel, comprising:

a base substrate comprising a display area and a non-display area;

wherein the display area comprises:

a plurality of sub-pixels;

a plurality of scan lines, wherein a row of sub-pixels in the plurality of sub-pixels is correspondingly coupled to at least one of the plurality of scan lines;

wherein the non-display area includes:

a gate driving circuit comprising the shift register units in the display panel according to claim 1, wherein the driving output terminal of each of the plurality of shift register units is correspondingly coupled to at least one of the plurality of scan lines.

7. The display panel according to claim 6, further comprising:

a plurality of output control signal lines coupled to the gate driving circuit;

wherein an extension direction of the plurality of output control signal lines is the same as an arrangement direction of the plurality of shift register units.

8. The display panel according to claim 7, wherein the plurality of output control signal lines are arranged between the gate driving circuit coupled thereto and the display area.

9. The display panel according to claim 8, wherein in two adjacent shift register units among the plurality of shift register units, an input signal terminal of a next shift register unit is coupled to a cascade output terminal of a previous shift register unit.

10. The display panel according to claim 7, further comprising:

a plurality of output control auxiliary signal lines;

wherein a first insulating layer is provided between the plurality of output control auxiliary signal lines and the plurality of output control signal lines;

the plurality of output control auxiliary signal lines correspond to the plurality of output control signal lines in a one-to-one manner, and the output control auxiliary signal lines and the output control signal lines corresponding to each other are coupled to each other through first through holes penetrating the first insulating layer.

11. The display panel according to claim 6, further comprising:

a plurality of clock signal lines coupled to the gate driving circuit;

wherein an extension direction of the plurality of clock signal lines is the same as an arrangement direction of the plurality of shift register units.

12. The display panel according to claim 11, wherein the plurality of clock signal lines are arranged on a side of the gate driving circuit coupled thereto away from the display area;

or wherein orthographic projections of the plurality of output control signal lines on the base substrate are arranged between orthographic projections of the plurality of clock signal lines on the base substrate and the display area;

or wherein an orthographic projection of the gate driving circuit on the base substrate is arranged between orthographic projections of the plurality of clock signal lines on the base substrate and orthographic projections of the plurality of output control signal lines on the base substrate, and the orthographic projections of the plurality of output control signal lines on the base substrate are arranged between the orthographic projection of the gate driving circuit on the base substrate and the display area.

13. The display panel according to claim 6, wherein an orthographic projection of the first output transistor on the base substrate is between an orthographic projection of the first cascade transistor on the base substrate and the display area.

14. The display panel according to claim 6, wherein a width of a channel of the first output transistor is greater than a width of a channel of the first cascade transistor.

15. The display panel according to claim 14, wherein the width of the channel of the first output transistor is not less than 100 μm or the width of the channel of the first cascade transistor is not greater than 60 μm.

16. The display panel according to claim 6, wherein an orthographic projection of the second output transistor on the base substrate is between an orthographic projection of the second cascade transistor on the base substrate and the display area;

or wherein a width of a channel of the second output transistor is greater than a width of a channel of the second cascade transistor.

17. The display panel according to claim 16, wherein the width of the channel of the second output transistor is not less than 100 μm, or the width of the channel of the second cascade transistor is not greater than 60 μm.

18. A display device, comprising:

the display panel according to claim 6;

a drive control circuit coupled to the display panel, and configured to:

input a first output control signal to output control signal terminals of the plurality of shift register units in a case of adopting a full-screen driving mode, so that the plurality of shift register units sequentially output gate scanning signals and drive the scan lines row by row;

input a second output control signal to the output control signal terminals of the plurality of shift register units in a case of adopting a local driving mode, so that some of the plurality of shift register units sequentially output gate scanning signals, and a rest of the plurality of shift register units output an invalid scanning signal.

19. A driving control method, comprising:

in a case of adopting a full-screen driving mode, inputting a first output control signal to output control signal terminals of a plurality of shift register units, so that the plurality of shift register units sequentially output gate scanning signals and drive scan lines row by row;

in a case of adopting a local driving mode, inputting a second output control signal to the output control signal terminals of the plurality of shift register units, so that some of the plurality of shift register units sequentially output gate scanning signals and a rest of the plurality of shift register units output an invalid scanning signal, and drive some of the scan lines.

20. The driving control method according to claim 19, wherein the first output control signal is a fixed voltage signal with a first level;

or wherein the second output control signal comprises a fixed voltage signal portion with a first level and a fixed voltage signal portion with a second level, the fixed voltage signal portion with the first level is input into the some of the plurality of shift register units, and the fixed voltage signal portion with the second level is input into the rest of the plurality of shift register units;

or wherein the first output control signal is a clock signal;

or wherein the second output control signal comprises a clock signal portion and a fixed voltage signal portion with a first level;

the clock signal portion of the second output control signal is input to the some of the plurality of the shift register units, and the fixed voltage signal portion with the first level is input to the rest of the plurality of shift register units.

* * * * *